(12) United States Patent
Kim et al.

(10) Patent No.: US 11,756,964 B2
(45) Date of Patent: Sep. 12, 2023

(54) METHOD FOR ETCHING INSULATING LAYER, METHOD FOR MANUFACTURING DISPLAY DEVICE USING THE SAME, AND DISPLAY DEVICE

(71) Applicant: Samsung Display Co., Ltd., Yongin-si (KR)

(72) Inventors: Dae Soo Kim, Seoul (KR); Yu-Gwang Jeong, Anyang-si (KR); Sung Won Cho, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 260 days.

(21) Appl. No.: 17/212,812

(22) Filed: Mar. 25, 2021

(65) Prior Publication Data

US 2022/0068979 A1     Mar. 3, 2022

(30) Foreign Application Priority Data

Aug. 28, 2020   (KR) .................. 10-2020-0109230

(51) Int. Cl.
*H01L 27/12*     (2006.01)
*H01L 29/786*    (2006.01)
(Continued)

(52) U.S. Cl.
CPC ...... *H01L 27/1251* (2013.01); *H01L 21/3065* (2013.01); *H01L 21/31116* (2013.01);
(Continued)

(58) Field of Classification Search
CPC ............ H01L 27/1251; H01L 21/3065; H01L 21/31116; H01L 21/31144; H01L 27/124; H01L 27/1259; H01L 29/78663
See application file for complete search history.

(56) References Cited

U.S. PATENT DOCUMENTS

| 7,288,476 B2 | 10/2007 | Varghese |
| 2002/0185466 A1* | 12/2002 | Furuta ............... H01L 21/32136 216/72 |
| 2016/0005804 A1* | 1/2016 | Oh ....................... H10K 10/486 438/239 |

FOREIGN PATENT DOCUMENTS

| KR | 1993-0006947 A | 4/1993 |
| KR | 10-0675937 B1 | 2/2007 |

(Continued)

*Primary Examiner* — Thao X Le
*Assistant Examiner* — Sean Ayers Winters
(74) *Attorney, Agent, or Firm* — Lewis Roca Rothgerber Christie LLP

(57) ABSTRACT

A method for etching an insulating layer includes: sequentially forming a first gate insulating layer, an amorphous silicon layer, a first interlayer insulating layer, and a second interlayer insulating layer on a substrate; applying a photoresist on the second interlayer insulating layer, and patterning the photoresist through a photo-process; first etching the second interlayer insulating layer and the first interlayer insulating layer until at least a portion of the amorphous silicon layer is exposed by using the patterned photoresist as a mask; second etching the second interlayer insulating layer and the first interlayer insulating layer; third etching the amorphous silicon layer; and fourth etching the first gate insulating layer, wherein an etching gas used in the second etching includes a material having a higher etching selection ratio of the first and second interlayer insulating layers to the amorphous silicon layer than an etching gas used in the first etching.

17 Claims, 19 Drawing Sheets

(51) Int. Cl.
    *H01L 21/3065*     (2006.01)
    *H01L 21/311*     (2006.01)

(52) U.S. Cl.
    CPC ...... *H01L 21/31144* (2013.01); *H01L 27/124* (2013.01); *H01L 27/1259* (2013.01); *H01L 29/78663* (2013.01)

(56) References Cited

FOREIGN PATENT DOCUMENTS

| | | | |
|---|---|---|---|
| KR | 10-2009-0095750 | A | 9/2009 |
| KR | 10-2123849 | B1 | 6/2020 |

\* cited by examiner

FIG. 7

★ SiNx Initial value

| 3689 | 3419 | 3239 | 3190 | 3200 | 3324 | 3426 |
|------|------|------|------|------|------|------|
| 3540 | 3880 | 3724 | 3667 | 3669 | 3749 | 3472 |
| 3422 | 3641 | 3443 | 3461 | 3404 | 3535 | 3439 |
| 3377 | 3525 | 3427 | 3459 | 3434 | 3475 | 3432 |
| 3523 | 3718 | 3525 | 3548 | 3489 | 3617 | 3527 |
| 3598 | 3894 | 3738 | 3680 | 3681 | 3815 | 3536 |
| 3773 | 3454 | 3234 | 3163 | 3209 | 3398 | 3542 |

| STD | 178 | MAX | 3894 | AVG | 3517 |
|-----|-----|-----|------|-----|------|
|     |     | MIN | 3163 | U/F | 10.40% |

★ SiNx Later value

| 3613 | 3347 | 3157 | 3106 | 3121 | 3253 | 3348 |
|------|------|------|------|------|------|------|
| 3460 | 3811 | 3651 | 3589 | 3599 | 3686 | 3401 |
| 3331 | 3566 | 3363 | 3375 | 3328 | 3469 | 3364 |
| 3285 | 3447 | 3344 | 3370 | 3354 | 3406 | 3354 |
| 3432 | 3643 | 3445 | 3463 | 3413 | 3548 | 3451 |
| 3519 | 3825 | 3663 | 3604 | 3611 | 3750 | 3462 |
| 3698 | 3378 | 3150 | 3077 | 3126 | 3324 | 3462 |

| STD | 182 | MAX | 3825 | AVG | 3440 |
|-----|-----|-----|------|-----|------|
|     |     | MIN | 3077 | U/F | 10.87% |

★ SiNx Etch amount

| 77 | 73 | 81 | 84 | 79 | 71 | 78 |
|----|----|----|----|----|----|----|
| 80 | 69 | 73 | 77 | 71 | 63 | 71 |
| 91 | 75 | 80 | 86 | 77 | 67 | 76 |
| 92 | 78 | 83 | 89 | 80 | 69 | 78 |
| 90 | 75 | 80 | 85 | 76 | 69 | 76 |
| 80 | 70 | 75 | 77 | 70 | 65 | 74 |
| 75 | 75 | 84 | 86 | 83 | 74 | 80 |

| STD | 7 | MAX | 92 | AVG | 77 |
|-----|---|-----|----|-----|----|
|     |   | MIN | 63 | U/F | 18.92% |

FIG. 8

★ a-Si Initial value

| 969 | 970 | 960 | 954 | 937 | 940 | 935 |
|---|---|---|---|---|---|---|
| 1005 | 995 | 983 | 987 | 972 | 961 | 937 |
| 1003 | 975 | 947 | 954 | 939 | 940 | 953 |
| 1016 | 969 | 947 | 935 | 945 | 949 | 946 |
| 1008 | 974 | 953 | 959 | 935 | 938 | 950 |
| 1006 | 989 | 992 | 994 | 969 | 955 | 947 |
| 984 | 986 | 981 | 975 | 961 | 952 | 942 |

| STD | 23 | MAX | 1016 | AVG | 965 |
|---|---|---|---|---|---|
| | | MIN | 933 | U/F | 4.32% |

★ a-Si Later value

| 758 | 749 | 682 | 651 | 669 | 736 | 712 |
|---|---|---|---|---|---|---|
| 739 | 832 | 780 | 766 | 777 | 810 | 698 |
| 660 | 758 | 712 | 678 | 709 | 758 | 661 |
| 664 | 740 | 682 | 647 | 693 | 758 | 660 |
| 705 | 770 | 712 | 692 | 694 | 762 | 655 |
| 761 | 838 | 775 | 769 | 774 | 814 | 763 |
| 751 | 760 | 703 | 672 | 683 | 731 | 709 |

| STD | 50 | MAX | 838 | AVG | 727 |
|---|---|---|---|---|---|
| | | MIN | 647 | U/F | 13.13% |

★ a-Si Etch amount

| 211 | 221 | 277 | 303 | 269 | 204 | 221 |
|---|---|---|---|---|---|---|
| 266 | 164 | 203 | 221 | 195 | 152 | 238 |
| 342 | 217 | 235 | 276 | 229 | 182 | 292 |
| 352 | 230 | 266 | 288 | 252 | 191 | 286 |
| 304 | 204 | 241 | 267 | 241 | 176 | 295 |
| 245 | 150 | 217 | 225 | 195 | 141 | 184 |
| 233 | 226 | 278 | 303 | 278 | 221 | 233 |

| STD | 48 | MAX | 352 | AVG | 238 |
|---|---|---|---|---|---|
| | | MIN | 141 | U/F | 44.46% |

FIG. 9

★ a-Si / SiNx etching selection ratio

| 2.76 | 3.04 | 3.41 | 3.60 | 3.40 | 2.88 | 2.84 |
|------|------|------|------|------|------|------|
| 3.31 | 2.57 | 2.78 | 2.87 | 2.76 | 2.41 | 3.35 |
| 3.74 | 2.89 | 2.94 | 3.21 | 2.99 | 2.72 | 3.86 |
| 3.88 | 2.96 | 3.20 | 3.25 | 3.15 | 2.78 | 3.69 |
| 3.37 | 2.71 | 3.02 | 3.14 | 3.18 | 2.56 | 3.88 |
| 3.08 | 2.16 | 2.89 | 2.93 | 2.78 | 2.17 | 2.51 |
| 3.10 | 3.00 | 3.30 | 3.54 | 3.36 | 2.97 | 2.90 |

|     | STD | 0.41 | MAX | 3.88 | AVG | 3.05 |
|-----|-----|------|-----|------|-----|------|
|     |     |      | MIN | 2.16 | U/F | 28.16% |

METHOD FOR ETCHING INSULATING LAYER, METHOD FOR MANUFACTURING DISPLAY DEVICE USING THE SAME, AND DISPLAY DEVICE

CROSS-REFERENCE TO RELATED APPLICATION

This application claims priority to and the benefit of Korean Patent Application No. 10-2020-0109230 filed in the Korean Intellectual Property Office (KIPO) on Aug. 28, 2020, the entire content of which is incorporated herein by reference.

BACKGROUND

1. Field

The present disclosure relates to a method for etching an insulating layer, a method for manufacturing a display device using the same, and a display device.

2. Description of the Related Art

An organic light emitting diode (OLED) display device includes two electrodes and an organic light emitting layer interposed therebetween, wherein electrons injected from one electrode and holes injected from another electrode are combined in the organic light emitting layer to generate excitons. The generated excitons are changed to a ground state from an excited state, releasing energy to emit light.

Such an organic light emitting diode display device includes a plurality of pixels including an organic light emitting diode which is a self-emissive device, and in each pixel, a plurality of transistors for driving the organic light emitting diode and at least one capacitor are formed.

In order to connect the plurality of transistors to each other, an opening may be formed in an insulating film, and an electrode connected through the opening may be formed. In order to realize high resolution, the number of layers forming the electrode may be increased while reducing a distance between respective electrodes. Accordingly, a depth of etching for forming the opening in the insulating film may be increased, and a defect may occur during the etching process.

The above information disclosed in this Background section is only for enhancement of understanding of the background of the described technology, and therefore it may contain information that is not prior art.

SUMMARY

Aspects of one or more embodiments of the present disclosure are directed towards a display device that, in a process of forming an opening by etching a plurality of stacked insulating layers, may prevent or substantially prevent a portion of an insulating layer from not being etched or from being overetched.

An embodiment provides a method for etching an insulating layer, the method including: sequentially forming a first gate insulating layer, an amorphous silicon layer, a first interlayer insulating layer, and a second interlayer insulating layer on a substrate; applying a photoresist on the second interlayer insulating layer, and patterning the photoresist through a photo-process; first etching the second interlayer insulating layer and the first interlayer insulating layer until at least a portion of the amorphous silicon layer is exposed by using the patterned photoresist as a mask; second etching the second interlayer insulating layer and the first interlayer insulating layer; third etching the amorphous silicon layer; and fourth etching the first gate insulating layer, wherein an etching gas used in the second etching includes a material having a higher etching selection ratio of the first and second interlayer insulating layers to the amorphous silicon layer than an etching gas used in the first etching.

The first etching may be performed until at least a portion of the amorphous silicon layer is exposed.

The etching gas used in the second etching may include at least one of pentafluoroethane ($C_2HF_5$), argon (Ar), or hydrogen ($H_2$).

At least a portion of the amorphous silicon layer may be etched in the second etching.

The etching gas used in the third etching may include chlorine ($Cl_2$).

The etching gas used in the third etching may include at least one of carbon tetrafluoride ($CF_4$) or oxygen ($O_2$).

The method for etching the insulating layer may further include forming a second gate insulating layer on the first gate insulating layer, wherein the second gate insulating layer may be between the first gate insulating layer and the amorphous silicon layer, and the second gate insulating layer may be etched in the fourth etching.

In the second etching, an etching selection ratio of the first interlayer insulating layer and the amorphous silicon layer may be 10:1.

In the third etching, an etching selection ratio of the amorphous silicon layer and the second gate insulating layer may be 3:1.

At least a portion of the second gate insulating layer may be etched in the third etching.

The method for etching the insulating layer may further include forming a second gate insulating layer on the amorphous silicon layer, wherein the second gate insulating layer may be between the amorphous silicon layer and the first interlayer insulating layer, and the second gate insulating layer may be etched in the second etching.

In the second etching, an etching selection ratio of the second gate insulating layer and the amorphous silicon layer may be 10:1.

In the third etching, the etching selection ratio of the amorphous silicon layer and the first gate insulating layer may be 3:1.

At least a portion of the first gate insulating layer may be etched in the third etching.

Another embodiment provides a method for manufacturing a display device, the method including: forming a semiconductor layer on a substrate; forming a first gate insulating layer on the semiconductor layer; forming a first gate conductive layer on the first gate insulating layer; forming an amorphous silicon layer on the first gate insulating layer; forming a first interlayer insulating layer on the amorphous silicon layer; forming a second interlayer insulating layer on the first interlayer insulating layer; etching the second interlayer insulating layer, the first interlayer insulating layer, and the first gate insulating layer to form an opening; and forming a first data conductive layer on the second interlayer insulating layer, the first data conductive layer connecting to the semiconductor layer through the opening, wherein the forming of the opening includes: applying a photoresist on the second interlayer insulating layer, and patterning the photoresist through a photo-process; first etching the second interlayer insulating layer and the first interlayer insulating layer until at least a portion of the amorphous silicon layer is exposed by using the patterned photoresist as a mask; second etching the second interlayer insulating layer and the first interlayer insulating layer; third etching the amorphous silicon layer; and fourth etching the first gate insulating layer, wherein an etching gas used in the second etching includes a material having a higher etching selection ratio of the first and second interlayer insulating layers to the amorphous silicon layer than an etching gas used in the first etching.

The method for manufacturing the display device may further include: forming a second gate insulating layer on the first gate conductive layer; and forming a second gate conductive layer on the second gate insulating layer, wherein the amorphous silicon layer may be on the second gate insulating layer.

The method for manufacturing the display device may further include: forming a second gate insulating layer on the amorphous silicon layer; and forming a second gate conductive layer on the second gate insulating layer, wherein the amorphous silicon layer may be on the first gate insulating layer.

Another embodiment provides a display device including: a substrate; a semiconductor layer on the substrate; a first gate insulating layer on the semiconductor layer; a first gate conductive layer on the first gate insulating layer, the first gate conductive layer overlapping the semiconductor layer; a second gate insulating layer on the first gate conductive layer; a second gate conductive layer on the second gate insulating layer; a first interlayer insulating layer on the second gate conductive layer; a second interlayer insulating layer on the first interlayer insulating layer; an amorphous silicon layer between the first gate insulating layer and the first interlayer insulating layer; and a first data conductive layer on the second interlayer insulating layer, the first data conductive layer connecting to the semiconductor layer, wherein the first gate insulating layer, the second gate insulating layer, the first interlayer insulating layer, the second interlayer insulating layer, and the amorphous silicon layer include an opening overlapping the semiconductor layer, and the first data conductive layer is connected to the semiconductor layer through the opening.

The amorphous silicon layer may be between the second gate insulating layer and the first interlayer insulating layer.

The amorphous silicon layer may be between the first gate insulating layer and the second gate insulating layer.

According to the embodiments, it is possible to prevent or substantially prevent a portion of an insulating layer from not being etched or from being overetched, by uniformly or substantially uniformly etching the insulating layer in a process of forming an opening by etching the plurality of insulating layers.

BRIEF DESCRIPTION OF THE DRAWINGS

FIG. 7 is a table showing thicknesses at positions before and after etching a layer containing a silicon nitride.

FIG. 8 is a table showing thicknesses at corresponding positions before and after etching a layer containing amorphous silicon.

FIG. 9 is a table showing etching selection ratios of a layer containing a silicon nitride and a layer containing amorphous silicon from the tables of FIG. 7 and FIG. 8.

DETAILED DESCRIPTION

Figure 1:
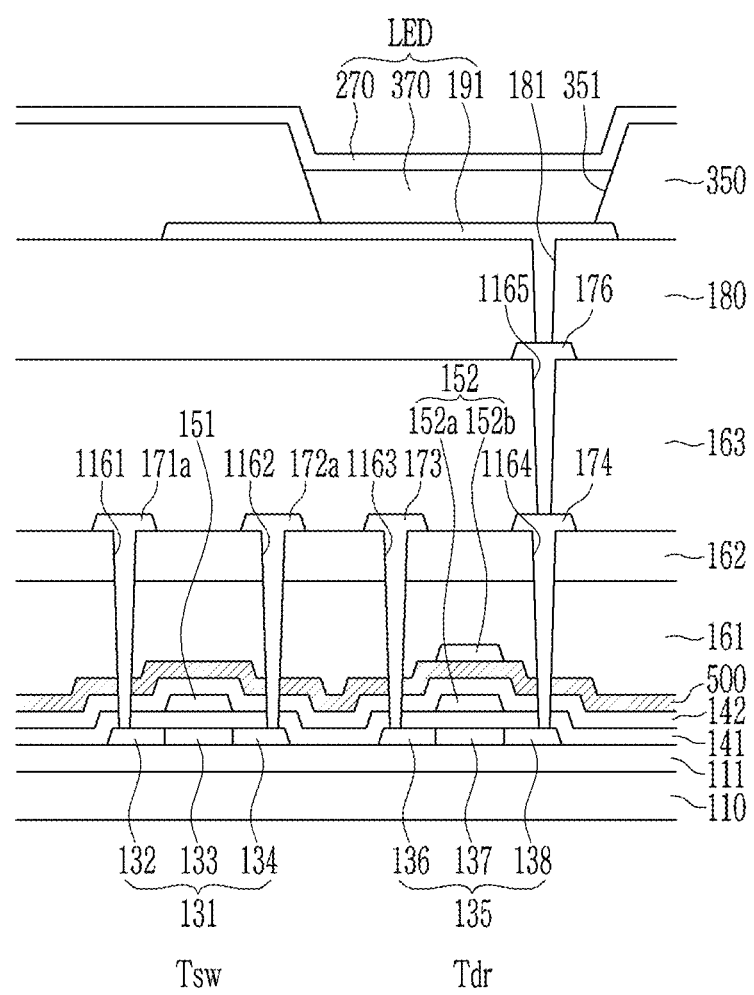
FIG. 1 illustrates a cross-sectional view of a display device according to an embodiment.

The present disclosure will be described more fully hereinafter with reference to the accompanying drawings, in which embodiments of the present disclosure are shown. As those skilled in the art would realize, the described embodiments may be modified in various different ways, all without departing from the spirit or scope of the present disclosure.

In order to clearly describe the present disclosure, parts that are irrelevant to the description are omitted, and identical or similar constituent elements throughout the specification are denoted by the same reference numerals.

Further, in the drawings, the size and thickness of each element are arbitrarily illustrated for ease of description, and the present disclosure is not necessarily limited to those illustrated in the drawings. In the drawings, the thickness of layers, films, panels, regions, etc., are exaggerated for clarity. In the drawings, for ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" refers to positioned on or below the object portion, and does not necessarily refer to positioned on the upper side of the object portion based on a gravitational direction.

As used herein, the singular forms "a," "an," and "the" are intended to include the plural forms as well, unless the context clearly indicates otherwise.

In addition, unless explicitly described to a first contrary, the term "comprise" and/or "include" and variations such as "comprises," "comprising," "includes," and/or "including" will be understood to imply the inclusion of stated elements but not the exclusion of any other elements.

As used herein, expressions such as "at least one of," "one of," and "selected from," when preceding a list of elements, modify the entire list of elements and do not modify the individual elements of the list.

As used herein, the term "and/or" includes any and all combinations of one or more of the associated listed items.

Further, the use of "may" when describing embodiments of the present disclosure refers to "one or more embodiments of the present disclosure".

It will be understood that when an element is referred to as being "connected to" another element, it may be directly connected to the other element or one or more intervening elements may also be present. When an element is referred to as being "directly connected to" another element, there are no intervening elements present.

In the drawings, the relative sizes of elements, layers, and regions may be exaggerated and/or simplified for clarity. Spatially relative terms, such as "beneath," "below," "lower," "above," "upper," "bottom," "top," and the like, may be used herein for ease of description to describe one element or feature's relationship to another element(s) or feature(s) as illustrated in the drawings. It will be understood that the spatially relative terms are intended to encompass different orientations of the device in use or operation in addition to the orientation depicted in the drawings. For example, if the device in the drawings is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

As used herein, the terms "substantially," "about," and similar terms are used as terms of approximation and not as terms of degree, and are intended to account for the inherent deviations in measured or calculated values that would be recognized by those of ordinary skill in the art.

As used herein, the terms "use," "using," and "used" may be considered synonymous with the terms "utilize," "utilizing," and "utilized," respectively.

Further, throughout the specification, the phrase "in a plan view" or "on a plane" refers to viewing a target portion from the top, and the phrase "in a cross-section" or "on a cross-section" refers to viewing a cross-section formed by vertically cutting a target portion from the side.

Unless otherwise defined, all terms (including technical and scientific terms) used herein have the same meaning as commonly understood by one of ordinary skill in the art to which this disclosure pertains. Terms, such as those defined in commonly used dictionaries, should be interpreted as having a meaning that is consistent with their meaning in the context of the relevant art and should not be interpreted in an idealized or overly formal sense, unless expressly so defined herein.

First, a display device according to an embodiment will be described in more detail below with reference to FIG. 1.

FIG. 1 illustrates a cross-sectional view of a display device according to an embodiment. For better comprehension and ease of description, FIG. 1 illustrates a first transistor Tsw, a second transistor Tdr, and a light emitting diode LED connected to the second transistor Tdr. The first transistor Tsw may be a switching transistor. The second transistor Tdr may be a driving transistor.

As shown in FIG. 1, a semiconductor layer including a semiconductor 131 of the first transistor Tsw and a semiconductor 135 of the second transistor Tdr may be disposed on a substrate 110.

The substrate 110 may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, cellulose triacetate, or cellulose acetate propionate. The substrate 110 may include a flexible material that may be bent or folded, and it may be a single layer or a multi-layer structure.

The semiconductor 131 of the first transistor Tsw may include a source region 132, a channel region 133, and a drain region 134. The source region 132 and the drain region 134 may be respectively disposed at opposite sides of the channel region 133 of the semiconductor 131 of the first transistor Tsw. The semiconductor 135 of the second transistor Tdr may include a source region 136, a channel region 137, and a drain region 138. The source region 136 and the drain region 138 may be disposed at opposite sides of the channel region 137 of the semiconductor 135 of the second transistor Tdr. The semiconductor 131 of the first transistor Tsw and the semiconductor 135 of the second transistor Tdr may include a polycrystalline semiconductor material.

A buffer layer 111 may be disposed between the substrate 110 and a semiconductor layer including the semiconductor 131 of the first transistor Tsw and the semiconductor 135 of the second transistor Tdr. The buffer layer 111 may have a single layer or multi-layer structure. The buffer layer 111 may include an inorganic insulating material such as a silicon nitride ($SiN_x$), a silicon oxide ($SiO_x$), and/or a silicon oxynitride ($SiO_xN_y$), or an organic insulating material. In addition, a barrier layer may be further disposed between the substrate 110 and the buffer layer 111. The barrier layer may have a single layer or multi-layer structure. The barrier layer may include an inorganic insulating material such as a silicon nitride (SiNx), a silicon oxide ($SiO_x$), and/or a silicon oxynitride ($SiO_xN_y$).

A first gate insulating layer 141 may be disposed on the semiconductor layer including the semiconductor 131 of the first transistor Tsw and the semiconductor 135 of the second transistor Tdr. The first gate insulating layer 141 may have a single layer or multi-layer structure. The first gate insulating layer 141 may include an inorganic insulating material such as a silicon nitride ($SiN_x$), a silicon oxide ($SiO_x$), and/or a silicon oxynitride ($SiO_xN_y$).

A first gate conductive layer including a gate electrode 151 of the first transistor Tsw and a lower gate electrode 152a of the second transistor Tdr may be disposed on the first gate insulating layer 141. The first gate conductive layer may have a single layer or multi-layer structure. The first gate conductive layer may include a metallic material such as molybdenum (Mo), aluminum (Al), copper (Cu), and/or titanium (Ti). The gate electrode 151 of the first transistor Tsw may overlap (e.g., overlap in a thickness direction of the substrate 110) the channel region 133 of the first transistor Tsw. The lower gate electrode 152a of the second transistor Tdr may overlap (e.g., overlap in the thickness direction of the substrate 110) the channel region 137 of the second transistor Tdr. After forming the first gate conductive layer, a doping process or plasma treatment may be performed. A portion of the semiconductor layer that is covered by the first gate conductive layer is not doped or plasma-treated, and a portion of the semiconductor layer that is not covered by the first gate conductive layer is doped or plasma-treated, so that it may have the same characteristics as a conductor.

A second gate insulating layer 142 may be disposed on the first gate conductive layer including the gate electrode 151 of the first transistor Tsw and the lower gate electrode 152a of the second transistor Tdr. The second gate insulating layer 142 may have a single layer or multi-layer structure. The second gate insulating layer 142 may include an inorganic insulating material such as a silicon nitride ($SiN_x$), a silicon oxide ($SiO_x$), and/or a silicon oxynitride ($SiO_xN_y$).

An amorphous silicon layer 500 may be disposed on the second gate insulating layer 142. The amorphous silicon layer 500 may be formed on the entire substrate 110. In one or more embodiments, the amorphous silicon layer 500 may be formed to cover most of the second gate insulating layer 142. The amorphous silicon layer 500 may include an amorphous silicon material.

A second gate conductive layer including an upper gate electrode 152b of the second transistor Tdr may be disposed on the amorphous silicon layer 500. The second gate conductive layer may have a single layer or multi-layer structure. The second gate conductive layer may include a metallic material such as molybdenum (Mo), aluminum (Al), copper (Cu), and/or titanium (Ti). The upper gate electrode 152b of the second transistor Tdr may overlap (e.g., overlap in a thickness direction of the substrate 110) the lower gate electrode 152a. The upper gate electrode 152b and the lower gate electrode 152a form a gate electrode 152 of the second transistor Tdr. The gate electrode 152 of the second transistor Tdr may overlap the channel region 137 of the semiconductor 135 in a direction perpendicular to the substrate 110 (i.e., a thickness direction of the substrate 110).

A first interlayer insulating layer 161 may be disposed on the second gate conductive layer including the upper gate electrode 152b of the second transistor Tdr. The first interlayer insulating layer 161 may have a single layer or multi-layer structure. The first interlayer insulating layer 161 may include an inorganic insulating material such as a silicon nitride ($SiN_x$), a silicon oxide ($SiO_x$), and/or a silicon oxynitride ($SiO_xN_y$).

A second interlayer insulating layer 162 may be disposed on the first interlayer insulating layer 161. The second interlayer insulating layer 162 may have a single layer or multi-layer structure. The second interlayer insulating layer 162 may include an inorganic insulating material such as a silicon nitride ($SiN_x$), a silicon oxide ($SiO_x$), and/or a silicon oxynitride ($SiO_xN_y$). The second interlayer insulating layer 162 may include or define a first opening 1161, a second opening 1162, a third opening 1163, and a fourth opening 1164.

The first opening 1161 may overlap (e.g., overlap in a thickness direction of the substrate 110) the source region 132 of the semiconductor 131 of the first transistor Tsw. The first opening 1161 may be further formed or defined in the first interlayer insulating layer 161, the amorphous silicon layer 500, the second gate insulating layer 142, and the first gate insulating layer 141 in addition to the second interlayer insulating layer 162.

The second opening 1162 may overlap (e.g., overlap in a thickness direction of the substrate 110) the drain region 134 of the semiconductor 131 of the first transistor Tsw. The second opening 1162 may be further formed or defined in the first interlayer insulating layer 161, the amorphous silicon layer 500, the second gate insulating layer 142, and the first gate insulating layer 141 in addition to the second interlayer insulating layer 162.

The third opening 1163 may overlap (e.g., overlap in a thickness direction of the substrate 110) the source region 136 of the semiconductor 135 of the second transistor Tdr. The third opening 1163 may be further formed or defined in the first interlayer insulating layer 161, the amorphous silicon layer 500, the second gate insulating layer 142, and the first gate insulating layer 141 in addition to the second interlayer insulating layer 162.

The fourth opening 1164 may overlap (e.g., overlap in a thickness direction of the substrate 110) the drain region 138 of the semiconductor 135 of the second transistor Tdr. The fourth opening 1164 may be further formed or defined in the first interlayer insulating layer 161, the amorphous silicon layer 500, the second gate insulating layer 142, and the first gate insulating layer 141 in addition to the second interlayer insulating layer 162.

A first data conductive layer including a source electrode 171a and a drain electrode 172a of the first transistor Tsw, and a source electrode 173 and a drain electrode 174 of the second transistor Tdr, may be disposed on the second interlayer insulating layer 162. The first data conductive layer may have a single layer or multi-layer structure. The first data conductive layer may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and/or copper (Cu).

The source electrode 171a of the first transistor Tsw may be connected to the source region 132 of the semiconductor 131 of the first transistor Tsw through the first opening 1161. The drain electrode 172a of the first transistor Tsw may be connected to the drain region 134 of the semiconductor 131 of the first transistor Tsw through the second opening 1162. The source electrode 173 of the second transistor Tdr may be connected to the source region 136 of the semiconductor 135 of the second transistor Tdr through the third opening 1163. The drain electrode 174 of the second transistor Tdr may be connected to the drain region 138 of the semiconductor 135 of the second transistor Tdr through the fourth opening 1164.

A third interlayer insulating layer 163 may be disposed on the first data conductive layer including the source electrode 171a and the drain electrode 172a of the first transistor Tsw and the source electrode 173 and the drain electrode 174 of the second transistor Tdr. The third interlayer insulating layer 163 may have a single layer or multi-layer structure. The third interlayer insulating layer 163 may include an organic insulating material such as a general purpose polymer such as polymethylmethacrylate (PMMA) or polystyrene (PS), a polymer derivative having a phenolic group, a acryl-based polymer, an imide-based polymer, a polyimide, an acryl-based polymer, and/or a siloxane-based polymer. The third interlayer insulating layer 163 may include or define an opening 1165 overlapping the drain electrode 174 of the second transistor Tdr. In one or more embodiments, the opening 1165 may overlap (e.g., overlap in the thickness direction of the substrate 110) the drain region 138 of the semiconductor 135 of the second transistor Tdr.

A second data conductive layer including a connection electrode 176 may be disposed on the third interlayer insulating layer 163. The second data conductive layer may have a single layer or multi-layer structure. The second data conductive layer may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and/or copper (Cu). The connection electrode 176 may be connected to the drain electrode 174 of the second transistor Tdr through the opening 1165.

A passivation layer 180 may be disposed on the second data conductive layer including the connection electrode 176. The passivation layer 180 may include an organic insulating material such as a general purpose polymer such as polymethylmethacrylate (PMMA) or polystyrene (PS), a polymer derivative having a phenolic group, an acryl-based polymer, an imide-based polymer, a polyimide, an acryl-based polymer, and/or a siloxane-based polymer. The passivation layer 180 may include an opening 181 overlapping (e.g., overlapping in the thickness direction of the substrate 110) the connection electrode 176.

An anode electrode 191 may be disposed on the passivation layer 180. The anode electrode 191 may be connected to the connection electrode 176 through opening 181. Accordingly, the anode electrode 191 may be connected to the drain electrode 174 of the second transistor Tdr through the connection electrode 176. In one or more embodiments, the anode electrode 191, the connection electrode 176, and the drain electrode 174 may be at different layers from each other.

A partition wall 350 may be disposed on the anode electrode 191. An opening 351 may be formed in the partition wall 350, and the opening 351 of the partition wall 350 may overlap the anode electrode 191. A light emitting element layer 370 may be disposed within the opening 351 of the partition wall 350. A cathode electrode 270 may be disposed on the light emitting element layer 370 and the partition wall 350. The anode electrode 191, the light emitting element layer 370, and the cathode electrode 270 may form a light emitting diode (LED).

Hereinafter, a method for etching an insulating layer according to an embodiment will be described in more detail below with reference to FIGS. 2-6.

FIGS. 2-6 sequentially illustrate process cross-sectional views of a method for etching an insulating layer according to an embodiment. FIGS. 2-6 illustrate some layers of the display device according to the embodiment shown in FIG. 1. FIGS. 2-6 illustrate a substrate, a buffer layer, a semiconductor layer, a first gate insulating layer, a second gate insulating layer, an amorphous silicon layer, a first interlayer insulating layer, and a second interlayer insulating layer. In the illustrated embodiment, a method for etching a plurality of stacked insulating layers is described in more detail below, and a first gate conductive layer, a second gate conductive layer, and the like disposed between the insulating layers are omitted.

Figure 2:
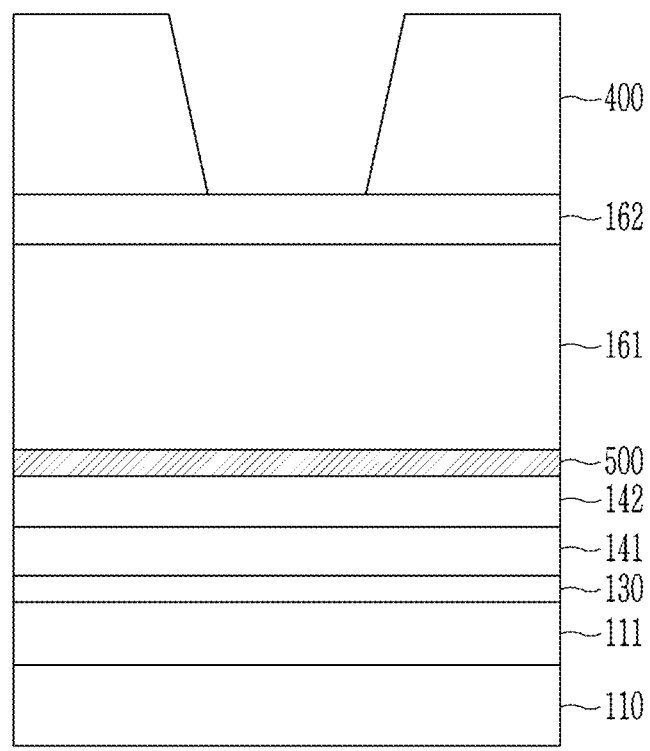
FIGS. 2-6 sequentially illustrate process cross-sectional views of a method for etching an insulating layer according to an embodiment.

First, as shown in FIG. 2, the first gate insulating layer 141, the second gate insulating layer 142, the amorphous silicon layer 500, the first interlayer insulating layer 161, and the second interlayer insulating layer 162 may be formed (e.g., sequentially formed) on the substrate 110. A semiconductor layer 130 may be disposed between the substrate 110 and the first gate insulating layer 141, and the buffer layer 111 may be disposed between the substrate 110 and the semiconductor layer 130.

For example, the first gate insulating layer 141 may be made of a silicon oxide, and may have a thickness of about 1200 Å (angstroms). The second gate insulating layer 142 may be made of a silicon nitride, and may have a thickness of about 1100 Å. The amorphous silicon layer 500 may be made of amorphous silicon, and may have a thickness of about 500 Å. The first interlayer insulating layer 161 may have a multi-layer structure, a layer thereof made of a silicon oxide may have a thickness of about 6000 Å, and a layer thereof made of a silicon nitride may have a thickness of about 2000 Å. In this case, the layer thereof made of the silicon nitride may be disposed on the layer thereof made of the silicon oxide. The second interlayer insulating layer 162 may be made of a silicon nitride, and may have a thickness of about 1100 Å. Accordingly, a plurality of insulating layers may have a thickness of about 11,900 Å as a whole. The material and thickness of the insulating layer described above are only examples, and may be variously changed in a suitable manner. As such, when a thick insulating layer in which several layers are stacked is etched at one time, some areas may remain without being etched (i.e., unetched), and other areas may be overetched and a layer disposed under the insulating layer may be damaged. In the illustrated embodiment, by forming the amorphous silicon layer 500 between the insulating layers in which several layers are stacked, etching may be uniformly or substantially uniformly performed in the entire area, which will be described in more detail below.

A photoresist 400 is applied on the second interlayer insulating layer 162 (e.g., the surface of the second interlayer insulating layer 162). Then, the photoresist 400 is patterned by matching a mask on the photoresist 400 (e.g., aligning a mask to cover portions of the photoresist 400), irradiating light (e.g., irradiating light onto exposed or uncovered portions of the photoresist 400), and then performing a photo-process such as developing (e.g., applying developer to remove portions of the photoresist 400).

Figure 3:
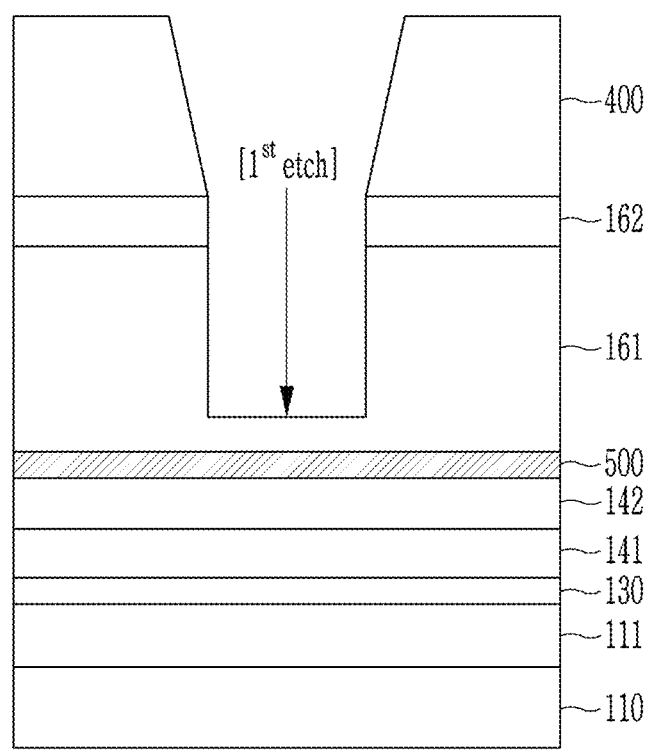

As shown in FIG. 3, a first etching step (i.e., act) ($1^{st}$ etch) of etching the second interlayer insulating layer 162 and the first interlayer insulating layer 161 is performed by using the patterned photoresist 400 as a mask. The first etching step ($1^{st}$ etch) may proceed until at least a portion of the amorphous silicon layer 500 is exposed. In this case, an etching gas may include carbon tetrafluoride ($CF_4$), oxygen ($O_2$), and the like. Because the etching gas does not have a high selection ratio, even after the amorphous silicon layer 500 is exposed, when the first etching step continuously proceeds, uniform or substantially uniform etching in the thickness direction may not be realized. Therefore, when at least a portion of the amorphous silicon layer 500 is exposed, the first etching step ($1^{st}$ etch) may be stopped. In this case, some areas are etched by a total thickness equal to at least the thicknesses of the second interlayer insulating layer 162 and the first interlayer insulating layer 161, thus the amorphous silicon layer 500 may be exposed in these areas, and some other areas are etched by a thickness less than the total thicknesses of the second interlayer insulating layer 162 and the first interlayer insulating layer 161, thus the amorphous silicon layer 500 may not be exposed in these other areas. That is, at least a portion of the first interlayer insulating layer 161 and/or the second interlayer insulating layer 162 that are not covered by the patterned photoresist 400 may remain (e.g., remain at the end of the first etching step).

Figure 4:
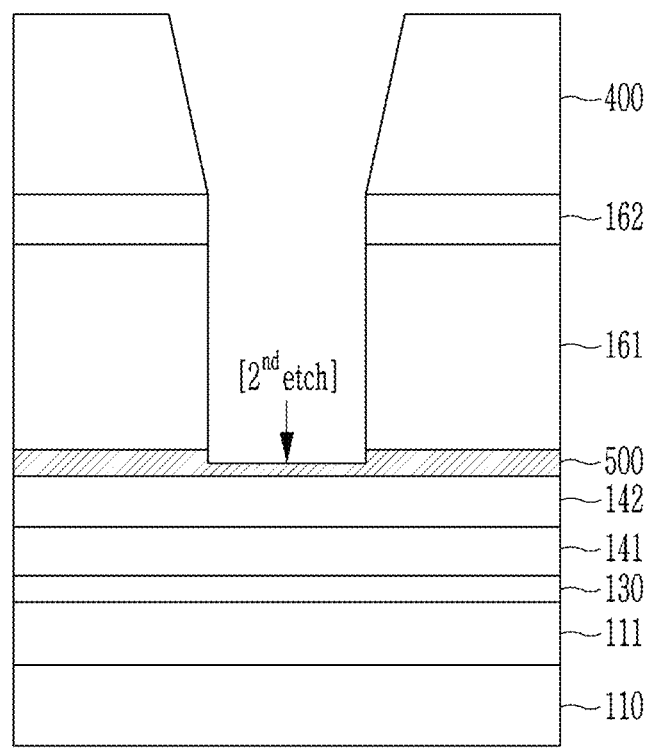

As shown in FIG. 4, a second etching step (i.e., act) ($2^{nd}$ etch) of etching the remaining first interlayer insulating layer 161 and second interlayer insulating layer 162 is performed. In the second etching step ($2^{nd}$ etch), at least a portion of the amorphous silicon layer 500 may be etched. FIG. 4 illustrates that the amorphous silicon layer 500 is uniformly or substantially uniformly etched for convenience, but in reality, the amorphous silicon layer 500 may be etched in some areas, and the amorphous silicon layer 500 may remain in some other areas. In this case, the etching gas may include pentafluoroethane ($C_2HF_5$), argon (Ar), hydrogen ($H_2$), and the like. The etching gas may be controlled to have a high selection ratio. The etching gas used in the second etching step ($2^{nd}$ etch) may include a material having a higher etching selection ratio of the first interlayer insulating layer 161 and the second interlayer insulating layer 162 with respect to the amorphous silicon layer 500 than the etching gas used in the first etching step ($1^{st}$ etch). For example, in the second etching step ($2^{nd}$ etch), the etching selection ratio of a silicon oxide and amorphous silicon may be about 10:1. That is, the etching selection ratio of a silicon oxide to amorphous silicon may be about 10. That is, when the amorphous silicon is etched by about 1, the silicon oxide may be etched by about 10. The first interlayer insulating layer 161 may have a multi-layer structure, and in this case, a lower layer thereof may include a silicon oxide. In the first etching step ($1^{st}$ etch), the second interlayer insulating layer 162 and an upper portion of the first interlayer insulating layer 161 are mostly etched, and in the second etching step ($2^{nd}$ etch), a lower portion of the first interlayer insulating layer 161 is mostly etched and a portion of the amorphous silicon layer 500 may be etched. The second etching step ($2^{nd}$ etch) may be performed until all of the first interlayer insulating layer 161 and the second interlayer insulating layer 162 that are not covered (e.g., not covered in the thickness direction) by the patterned photoresist 400 are removed. Because the second etching step ($2^{nd}$ etch) proceeds in a state in which the etching selection ratio of the first interlayer insulating layer 161 and the second interlayer insulating layer 162 with respect to the amorphous silicon layer 500 is high, the amorphous silicon layer 500 may remain. That is, at least a portion of the amorphous silicon layer 500 that is not covered by the patterned photoresist 400 may be in a remaining state.

Figure 5:
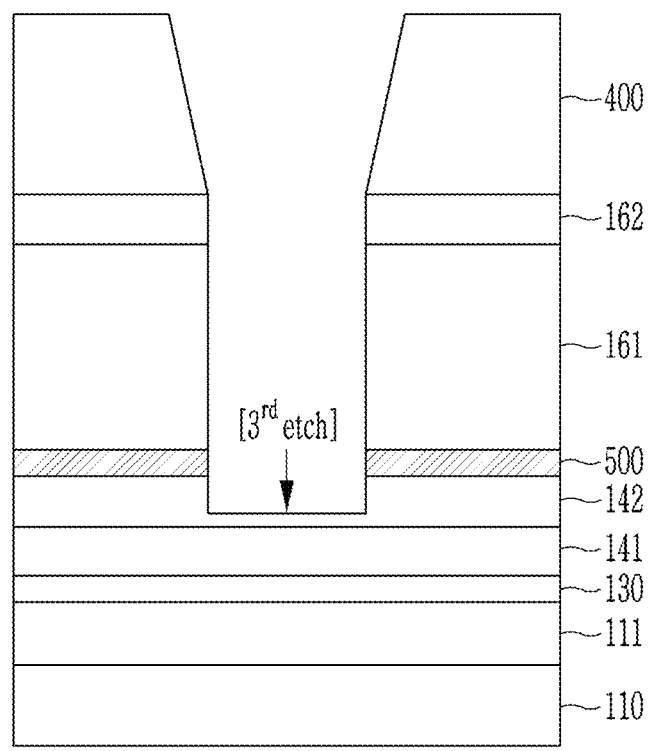

As shown in FIG. 5, a third etching step (i.e., act) ($3^{rd}$ etch) of etching the amorphous silicon layer 500 is performed. In the third etching step ($3^{rd}$ etch), at least a portion of the second gate insulating layer 142 may be etched. In this case, the etching gas may include carbon tetrafluoride ($CF_4$), oxygen ($O_2$), and the like as in the first etching step ($1^{st}$ etch). In addition, the etching gas may further include chlorine ($Cl_2$). Because the etching gas further includes chlorine ($Cl_2$), the etching selection ratio of the second gate insulating layer 142 to the amorphous silicon layer 500 may be reduced. For example, in the third etching step ($3^{rd}$ etch), the selection ratio of the amorphous silicon and the silicon nitride may be about 3:1. That is, the selection ratio of a silicon nitride to amorphous silicon may be about ⅓. That is, when the amorphous silicon is etched by about 1, the silicon nitride may be etched by about ⅓. Therefore, compared to the second gate insulating layer 142, the amorphous silicon layer 500 may be etched at a faster speed. The third etching step ($3^{rd}$ etch) may be performed until all of the amorphous silicon layer 500 that is not covered (e.g., not covered in the thickness direction) by the patterned photoresist 400 is removed. Because the third etching step ($3^{rd}$ etch) is performed in a state in which the etching selection ratio of the second gate insulating layer 142 to the amorphous silicon layer 500 is low, the second gate insulating layer 142 may remain. That is, at least a portion of the second gate insulating layer 142 that is not covered by the patterned photoresist 400 may be in a remaining state.

Figure 6:
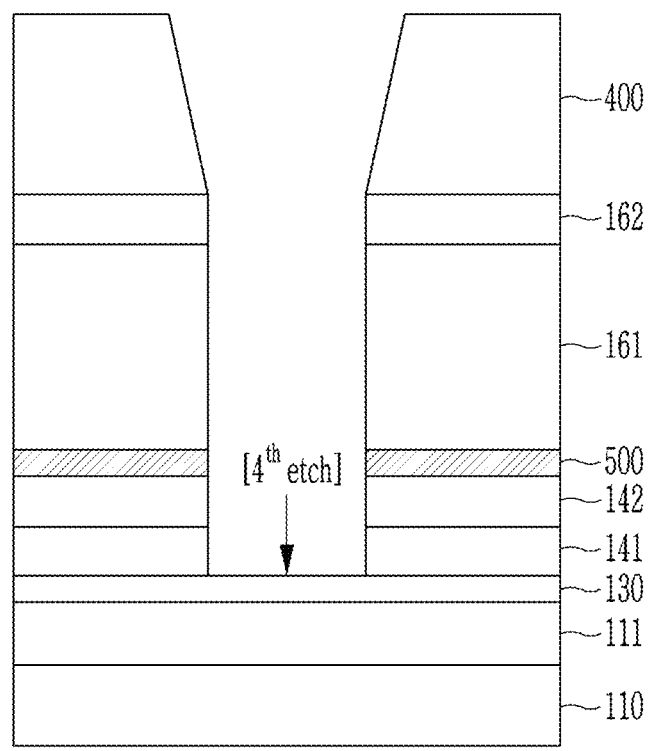

As shown in FIG. 6, a fourth etching step (i.e., act) ($4^{th}$ etch) of etching the second gate insulating layer 142 and the first gate insulating layer 141 is performed. In the fourth etching step ($4^{th}$ etch), an etching gas capable of etching a silicon nitride or a silicon oxide may be used. In the fourth etching step ($4^{th}$ etch), portions of the second gate insulating layer 142 and the first gate insulating layer 141 that are not covered by the patterned photoresist 400 may be removed. Accordingly, the semiconductor layer 130 may be exposed.

In the illustrated embodiment, the amorphous silicon layer 500 is disposed between the second gate insulating layer 142 and the first interlayer insulating layer 161. In this case, in the second etching step ($2^{nd}$ etch), the etching selection ratio of the first interlayer insulating layer 161 to the amorphous silicon layer 500 is high, and in the third etching step ($3^{rd}$ etch), the etching selection ratio of the second gate insulating layer 142 to the amorphous silicon layer 500 is low. As described above, uniform or substantially uniform etching may be realized by performing the etching process through various etching steps by adjusting the etching selection ratio of the thick insulating layers in which several layers are stacked. Therefore, in the illustrated embodiment, it is possible to prevent or substantially prevent some of the insulating layers from remaining or the layer disposed under the insulating layers, for example, the semiconductor layer 130, from being damaged.

Hereinafter, a method for manufacturing a display device according to an embodiment will be described in more detail below with reference to FIGS. 1-6 again.

First, a semiconductor layer including the semiconductor 131 of the first transistor Tsw and the semiconductor 135 of the second transistor Tdr may be formed on the substrate 110 by using a polycrystalline semiconductor material. The first gate insulating layer 141 may be formed on the semiconductor layer. A metallic material may be deposited on the first gate insulating layer 141 and patterned to form a first gate conductive layer including the gate electrode 151 of the first transistor Tsw and the lower gate electrode 152a of the second transistor Tdr. The second gate insulating layer 142 may be formed on the first gate conductive layer. The amorphous silicon layer 500 may be formed on the second gate insulating layer 142. A metallic material may be deposited on the amorphous silicon layer 500 and patterned to form a second gate conductive layer. The first interlayer insulating layer 161 may be formed on the second gate conductive layer. The second interlayer insulating layer 162 may be formed on the first interlayer insulating layer 161.

Then, the second interlayer insulating layer 162, the first interlayer insulating layer 161, the amorphous silicon layer 500, the second gate insulating layer 142, and the first gate insulating layer 141 are etched to form the first opening 1161, the second opening 1162, the third opening 1163, and the fourth opening 1164. The first opening 1161, the second opening 1162, the third opening 1163, and the fourth opening 1164 are formed to penetrate the second interlayer insulating layer 162, the first interlayer insulating layer 161, the amorphous silicon layer 500, the second gate insulating layer 142, and the first gate insulating layer 141, and at least a portion of the semiconductor layer may be exposed. By forming the first opening 1161, the source region 132 of the semiconductor 131 of the first transistor Tsw may be exposed, and by forming the second opening 1162, the drain region 134 of the semiconductor 131 of the first transistor Tsw may be exposed. By forming the third opening 1163, the source region 136 of the semiconductor 135 of the second transistor Tdr may be exposed, and by forming the fourth opening 1164, the drain region 138 of the semiconductor 135 of the second transistor Tdr may be exposed.

As described above, the step (i.e., act) of etching the second interlayer insulating layer 162, the first interlayer insulating layer 161, the amorphous silicon layer 500, the second gate insulating layer 142, and the first gate insulating layer 141 may include four etching steps (i.e., acts). First, for the first etching step ($1^{st}$ etch), the photoresist 400 is applied on the second interlayer insulating layer 162, patterned, and then used as a mask, and the first etching step ($1^{st}$ etch) may be performed until at least a portion of the amorphous silicon layer 500 is exposed. Then, the second etching step ($2^{nd}$ etch) is performed to etch the first interlayer insulating layer 161 and the second interlayer insulating layer 162. The etching gas used in the second etching step ($2^{nd}$ etch) may include a material having a higher etching selection ratio of the first interlayer insulating layer 161 and the second interlayer insulating layer 162 with respect to the amorphous silicon layer 500 than the etching gas used in the first etching step ($1^{st}$ etch). Then, the third etching step ($3^{rd}$ etch) is performed to etch the amorphous silicon layer 500. In the third etching step ($3^{rd}$ etch), because chlorine ($Cl_2$) gas is added as an etching gas, the etching selection ratio of the second gate insulating layer 142 to the amorphous silicon layer 500 may be lowered. Then, the fourth etching step ($4^{th}$ etch) of etching the second gate insulating layer 142 and the first gate insulating layer 141 is performed. In the illustrated embodiment, uniform or substantially uniform etching may be realized by etching the insulating layers (e.g., thick insulating layers) in which several layers are stacked through various suitable etching steps (i.e., acts) by adjusting the etching selection ratio. Therefore, in the illustrated embodiment, it is possible to prevent or substantially prevent some of the insulating layers from remaining or the layer disposed under the insulating layers, for example, the semiconductor layer 130, from being damaged.

Next, a metallic material may be deposited on the second interlayer insulating layer 162 and patterned to form a first data conductive layer including the source electrode 171a and the drain electrode 172a of the first transistor Tsw and the source electrode 173 and the drain electrode 174 of the second transistor Tdr. The third interlayer insulating layer 163 may be formed on the first data conductive layer. The opening 1165 may be formed in the third interlayer insulating layer 163, and the second data conductive layer including the connection electrode 176 may be formed on the third interlayer insulating layer 163. The passivation layer 180 may be formed on the second data conductive layer. The opening 181 may be formed in the passivation layer 180, and the anode electrode 191 may be formed on the passivation layer 180. In one or more embodiments, a partition wall 350 may be formed on the anode electrode 191, the opening 351 may be formed in the partition wall 350, and the light emitting element layer 370 may be formed in the opening 351. The cathode electrode 270 may be formed on the light emitting element layer 370 and the partition wall 350.

Hereinafter, the third etching step ($3^{rd}$ etch) of the method for etching the insulating layer according to the embodiment will be further described in more detail below with reference to FIGS. 7-9. In the third etching step ($3^{rd}$ etch), because the etching gas includes chlorine ($Cl_2$), the etching selection ratio of the second gate insulating layer 142 to the amorphous silicon layer 500 is lowered, which will be described in more detail below through an experimental result.

FIG. 7 is a table showing thicknesses at positions before and after etching a layer containing a silicon nitride, FIG. 8 is a table showing thicknesses at corresponding positions before and after etching a layer containing amorphous silicon, and FIG. 9 is a table showing etching selection ratios of a layer containing a silicon nitride and a layer containing amorphous silicon from the tables of FIG. 7 and FIG. 8. Numerical values of FIG. 7 and FIG. 8 are data obtained from the etching process under the same conditions.

As shown in FIG. 7, depending on position, the layer including a silicon nitride may have a thickness of about 3163 Å to about 3894 Å before the etching process is performed. Depending on the position thereof, the thickness of the layer including the silicon nitride may be varied, and its average thickness may be about 3517 Å. As the etching process proceeds, the thickness of the layer including the silicon nitride decreases. Depending on position, the layer including the silicon nitride may have a thickness of about 3077 Å to about 3825 Å after the etching process is performed. Depending on the position thereof, the thickness of the layer including the silicon nitride may be varied, and its average thickness may be about 3440 Å. Depending on position, the thickness reduction by etching may be about 63 Å to about 92 Å. An average thickness reduction of about 77 Å may be performed by the etching process.

As shown in FIG. 8, depending on position, the layer including the amorphous silicon may have a thickness of about 933 Å to about 1016 Å before the etching process is performed. Depending on the position thereof, the thickness of the layer including the amorphous silicon may be varied, and its average thickness may be about 965 Å. As the etching process proceeds, the thickness of the layer including the amorphous silicon decreases. Depending on position, the layer including the amorphous silicon may have a thickness of about 647 Å to about 838 Å after the etching process is performed. Depending on the position thereof, the thickness of the layer including the amorphous silicon may be varied, and its average thickness may be about 727 Å. Depending on position, the thickness reduction by etching may be about 141 Å to about 352 Å. An average thickness reduction of about 238 Å may be performed by the etching process.

As shown in FIG. 9, from the experimental results of FIG. 7 and FIG. 8, the etching selection ratio of an etching amount of the layer including the amorphous silicon to an etching amount of the layer including the silicon nitride may be calculated. When the etching selection ratio is the smallest, it may be about 2.16, and when the etching selection ratio is the largest, it may be about 3.88. In other words, depending on position, the smallest or lowest etching selection ratio may be about 2.16, and the largest or highest etching selection ratio may be about 3.88. The average etching selection ratio may be about 3.05.

The data shown in FIGS. 7-9 are results of the etching process using an etching gas including chlorine ($Cl_2$) gas, and it can be seen that the etching selection ratio is lowered when the etching gas includes the chlorine ($Cl_2$) gas.

Hereinafter, the result when the etching is uniformly or substantially uniformly performed by the method for etching the insulating layer according to the embodiment will be described in more detail below in comparison with that of the insulating layer according to a comparative example, with reference to FIG. 10 and FIG. 11.

Figure 10:
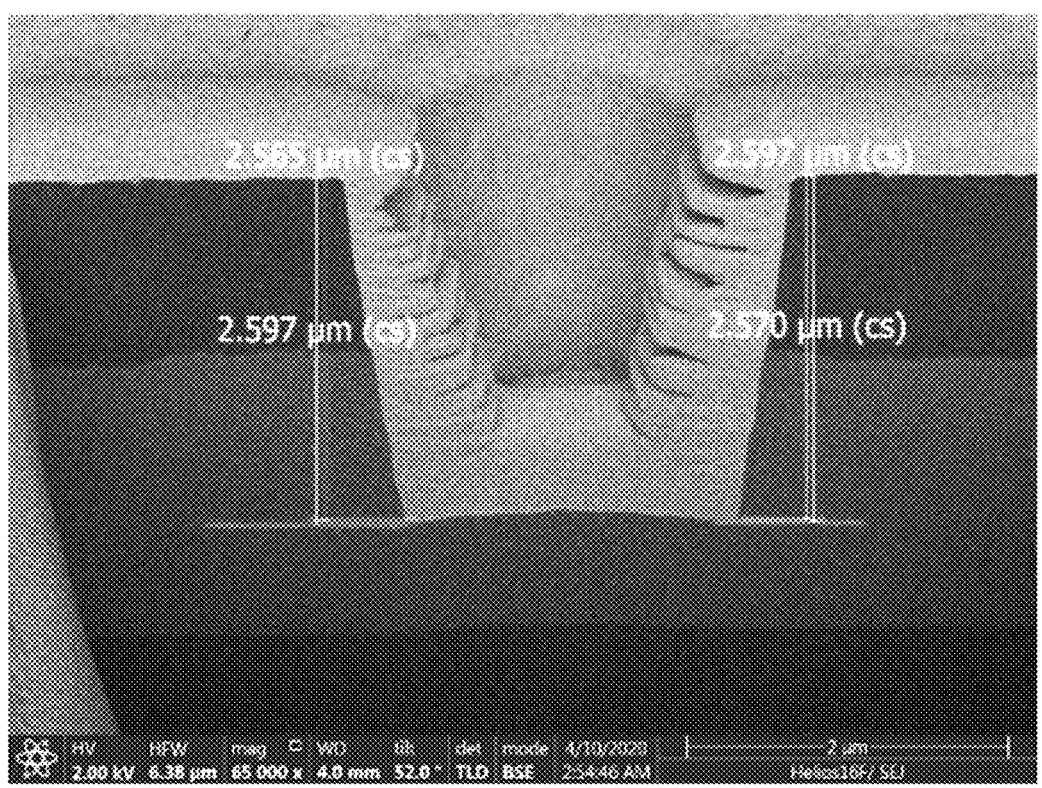
FIG. 10 illustrates an insulating layer etched by a method for etching an insulating layer according to an embodiment.
Figure 11:
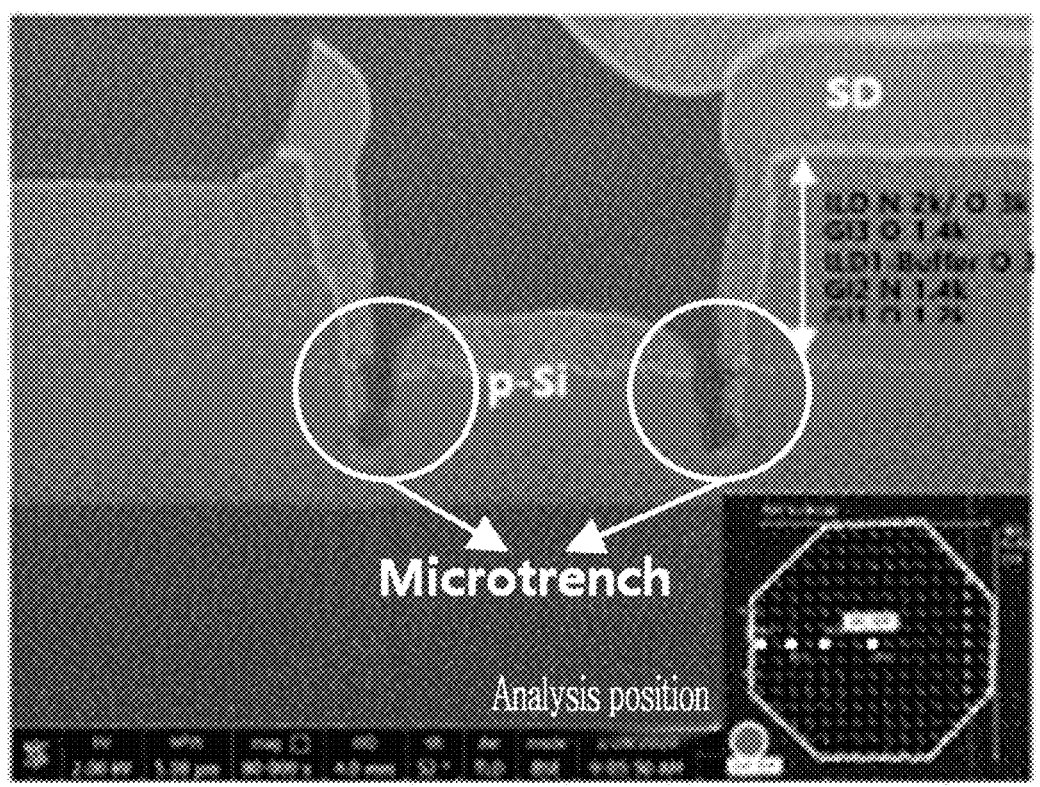
FIG. 11 illustrates an insulating layer etched by a method for etching an insulating layer according to a comparative example.

FIG. 10 illustrates an insulating layer etched by a method for etching an insulating layer according to an embodiment, and FIG. 11 illustrates an insulating layer etched by a method for etching an insulating layer according to a comparative example.

As shown in FIG. 10, when the amorphous silicon layer is formed by the method for etching the insulating layer according to the embodiment, and when the etching process is performed while changing the etching conditions through several steps, a uniform or substantially uniform pattern may be formed.

As shown in FIG. 11, when a thick insulating layer in which several layers are stacked is etched at one time by the method for etching the insulating layer according to the comparative example, the etching is not performed properly in some areas, so that the insulating layer may remain therein, and some other areas, for example, an edge portion thereof, may be overetched, so that a layer disposed under the insulating layer may be damaged.

According to the method for etching the insulating layer according to the embodiment, the insulating layer is uniformly or substantially uniformly etched, so that influence on other layers around the insulating layer may be reduced, and element stability may be improved.

Hereinafter, a display device according to an embodiment will be described in more detail below with reference to FIG. 12.

Figure 12:
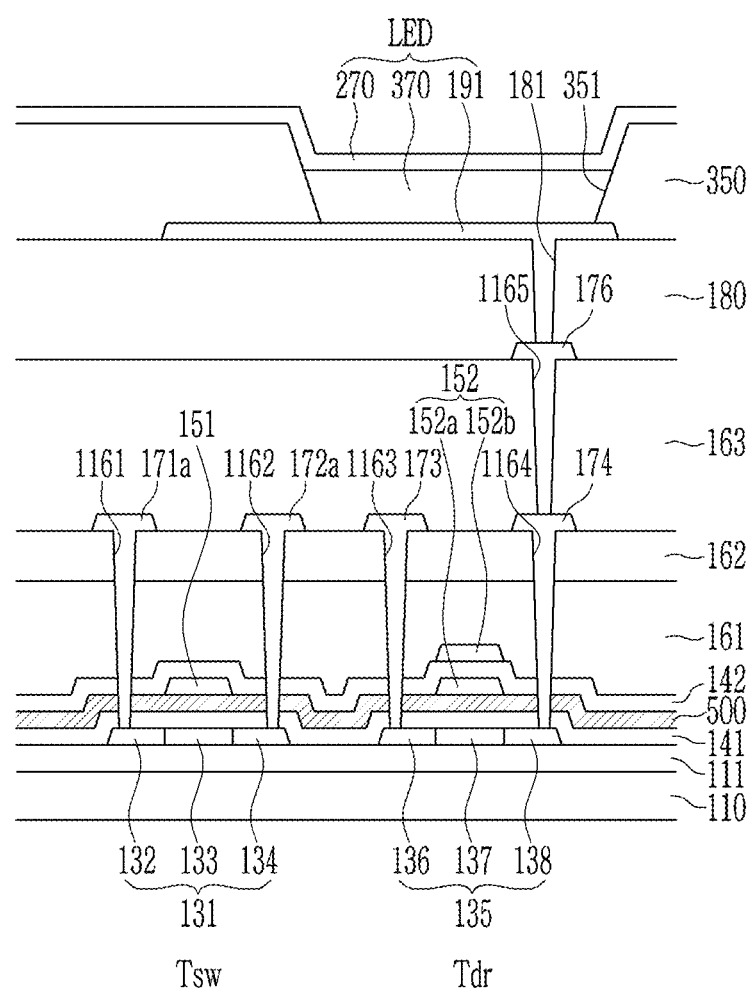
FIG. 12 illustrates a cross-sectional view of a display device according to an embodiment.

Because many portions of the display device according to the embodiment shown in FIG. 12 are the same as those of the display device according to the embodiment shown in FIG. 1, a repeated description thereof will be omitted. The illustrated embodiment differs from the previous embodiment in that the amorphous silicon layer is disposed between the first gate insulating layer and the second gate insulating layer, and will be further described in more detail below.

FIG. 12 illustrates a cross-sectional view of a display device according to an embodiment.

As shown in FIG. 12, the semiconductor layer including the semiconductor 131 of the first transistor Tsw and the semiconductor 135 of the second transistor Tdr may be disposed on the substrate 110. The first gate insulating layer 141 may be disposed on the semiconductor layer. The amorphous silicon layer 500 may be disposed on the first gate insulating layer 141. The first gate conductive layer including the gate electrode 151 of the first transistor Tsw and the lower gate electrode 152a of the second transistor Tdr may be disposed on the amorphous silicon layer 500. The second gate insulating layer 142 may be disposed on the first gate conductive layer. The second gate conductive layer including the upper gate electrode 152b of the second transistor Tdr may be disposed on the second gate insulating layer 142. The first interlayer insulating layer 161 may be disposed on the second gate conductive layer. The second interlayer insulating layer 162 may be disposed on the first interlayer insulating layer 161. The second interlayer insulating layer 162 may include the first opening 1161, the second opening 1162, the third opening 1163, and the fourth opening 1164. The first opening 1161, the second opening 1162, the third opening 1163, and the fourth opening 1164 are formed to penetrate not only the second interlayer insulating layer 162, but also the first interlayer insulating layer 161, the second gate insulating layer 142, the amorphous silicon layer 500, and the first gate insulating layer 141.

The first data conductive layer including the source electrode 171a and the drain electrode 172a of the first transistor Tsw, and the source electrode 173 and the drain electrode 174 of the second transistor Tdr may be disposed on the second interlayer insulating layer 162. The source electrode 171a of the first transistor Tsw may be connected to the source region 132 of the semiconductor 131 of the first transistor Tsw through the first opening 1161. The drain electrode 172a of the first transistor Tsw may be connected to the drain region 134 of the semiconductor 131 of the first transistor Tsw through the second opening 1162. The source electrode 173 of the second transistor Tdr may be connected to the source region 136 of the semiconductor 135 of the second transistor Tdr through the third opening 1163. The drain electrode 174 of the second transistor Tdr may be connected to the drain region 138 of the semiconductor 135 of the second transistor Tdr through the fourth opening 1164.

The third interlayer insulating layer 163 may be disposed on the first data conductive layer. The second data conductive layer including the connection electrode 176 may be disposed on the third interlayer insulating layer 163. The passivation layer 180 may be disposed on the second data conductive layer. The anode electrode 191 may be disposed on the passivation layer 180. The partition wall 350 may be disposed on the anode electrode 191. The opening 351 may be formed in the partition wall 350, and the opening 351 of the partition wall 350 may overlap the anode electrode 191. The light emitting element layer 370 may be disposed within the opening 351 of the partition wall 350. The cathode electrode 270 may be disposed on the light emitting element layer 370 and the partition wall 350. The anode electrode 191, the light emitting element layer 370, and the cathode electrode 270 may form a light emitting diode (LED).

Hereinafter, a method for etching an insulating layer according to an embodiment will be described in more detail below with reference to FIGS. 13-17.

FIGS. 13-17 sequentially illustrate process cross-sectional views of a method for etching an insulating layer according to an embodiment. FIGS. 13-17 illustrate some layers of the display device according to the embodiment shown in FIG. 12. FIGS. 13-17 illustrate a substrate, a buffer layer, a semiconductor layer, a first gate insulating layer, an amorphous silicon layer, a second gate insulating layer, a first interlayer insulating layer, and a second interlayer insulating layer. In the illustrated embodiment, a method for etching a plurality of stacked insulating layers is described in more detail below, and a first gate conductive layer, a second gate conductive layer, and the like disposed between the insulating layers are omitted.

Figure 13:
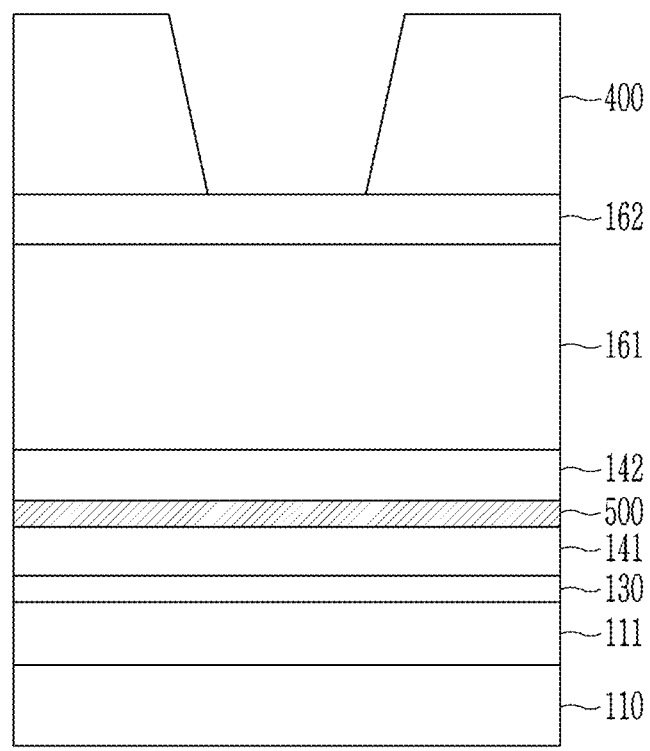
FIGS. 13-17 sequentially illustrate process cross-sectional views of a method for etching an insulating layer according to an embodiment.

First, as shown in FIG. 13, the first gate insulating layer 141, the amorphous silicon layer 500, the second gate insulating layer 142, the first interlayer insulating layer 161, and the second interlayer insulating layer 162 may be formed (e.g., sequentially formed) on the substrate 110. The semiconductor layer 130 may be disposed between the substrate 110 and the first gate insulating layer 141, and the buffer layer 111 may be disposed between the substrate 110 and the semiconductor layer 130.

For example, the first gate insulating layer 141 may be made of a silicon oxide, and may have a thickness of about 1200 Å. The amorphous silicon layer 500 may be made of amorphous silicon, and may have a thickness of about 500 Å. The second gate insulating layer 142 may be made of a silicon nitride, and may have a thickness of about 1100 Å. The first interlayer insulating layer 161 may have a multi-layer structure, a layer thereof made of a silicon oxide may have a thickness of about 6000 Å, and a layer thereof made of a silicon nitride may have a thickness of about 2000 Å. In this case, the layer thereof made of the silicon nitride may be disposed on the layer thereof made of the silicon oxide. The second interlayer insulating layer 162 may be made of a silicon nitride, and may have a thickness of about 1100 Å. Accordingly, a plurality of insulating layers may have a thickness of about 11,900 Å as a whole. The material and thickness of the insulating layer described above are only examples, and may be variously changed in a suitable manner. As such, when a thick insulating layer in which several layers are stacked is etched at one time, some areas may remain without being etched (i.e., unetched), and other areas may be overetched and a layer disposed under the insulating layer may be damaged. In the illustrated embodiment, by forming the amorphous silicon layer 500 between the insulating layers in which several layers are stacked, etching may be uniformly or substantially uniformly performed in the entire area, which will be described in more detail below.

The photoresist 400 is applied on the second interlayer insulating layer 162 (e.g., the surface of the second interlayer insulating layer 162). Then, the photoresist 400 is patterned by matching a mask on the photoresist 400 (e.g., aligning a mask to cover portions of the photoresist 400), irradiating light (e.g., irradiating light onto exposed or uncovered portions of the photoresist 400), and then performing a photo-process such as developing (e.g., applying developer to remove portions of the photoresist 400).

Figure 14:
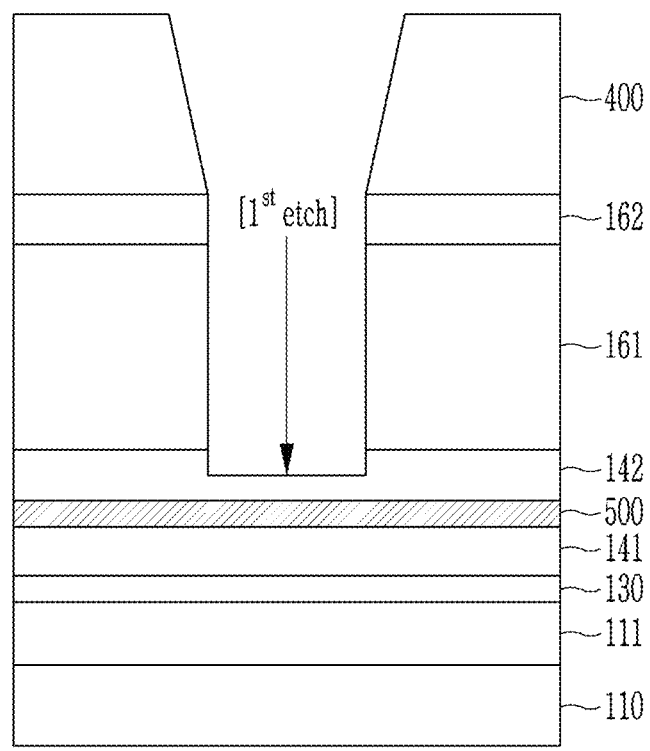

As shown in FIG. 14, a first etching step (i.e., act) ($1^{st}$ etch) of etching the second interlayer insulating layer 162, the first interlayer insulating layer 161, and the second gate insulating layer 142 is performed by using the patterned photoresist 400 as a mask. The first etching step ($1^{st}$ etch) may proceed until at least a portion of the amorphous silicon layer 500 is exposed. In this case, an etching gas may include carbon tetrafluoride ($CF_4$), oxygen ($O_2$), and the like. Because the etching gas does not have a high selection ratio, even after the amorphous silicon layer 500 is exposed, when the first etching step continuously proceeds, uniform or substantially uniform etching may not be realized. Therefore, when at least a portion of the amorphous silicon layer 500 is exposed, the first etching step ($1^{st}$ etch) may be stopped. In this case, some areas are etched by a total thickness at least equal to the thicknesses of the second interlayer insulating layer 162, the first interlayer insulating layer 161, and the second gate insulating layer 142, thus the amorphous silicon layer 500 may be exposed in these areas, and some other areas are etched by a thickness less than the total thicknesses of the second interlayer insulating layer 162, the first interlayer insulating layer 161, and the second gate insulating layer 142, thus the amorphous silicon layer 500 may not be exposed in these other areas. That is, at least a portion of the first interlayer insulating layer 161, the second interlayer insulating layer 162, and/or the second gate insulating layer 142 that are not covered by the patterned photoresist 400 may remain (e.g., remain at the end of the first etching step).

Figure 15:
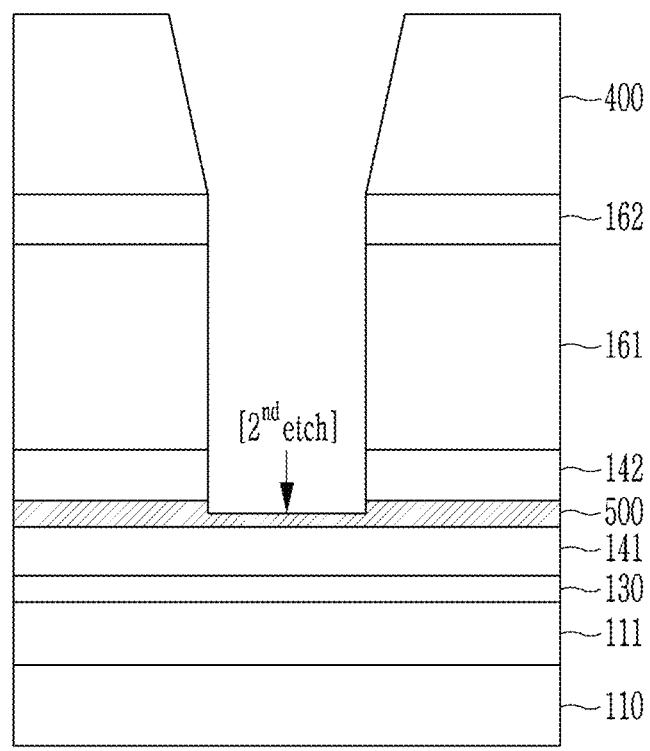

As shown in FIG. 15, a second etching step (i.e., act) ($2^{nd}$ etch) of etching the remaining first interlayer insulating layer 161, the second interlayer insulating layer 162, and the second gate insulating layer 142 is performed. In the second etching step ($2^{nd}$ etch), at least a portion of the amorphous silicon layer 500 may be etched. FIG. 15 illustrates that the amorphous silicon layer 500 is uniformly or substantially uniformly etched for convenience, but in reality, the amorphous silicon layer 500 may be etched in some areas, and the amorphous silicon layer 500 may remain in some other areas. In this case, the etching gas may include pentafluoroethane ($C_2HF_5$), argon (Ar), hydrogen ($H_2$), and the like. The etching gas may be controlled to have a high selection ratio. The etching gas used in the second etching step ($2^{nd}$ etch) may include a material having a higher etching selection ratio of the first interlayer insulating layer 161, the second interlayer insulating layer 162, and the second gate insulating layer 142 to the amorphous silicon layer 500 than the etching gas used in the first etching step ($1^{st}$ etch). The second etching step ($2^{nd}$ etch) may be performed until all of the first interlayer insulating layer 161, the second interlayer insulating layer 162, and the second gate insulating layer 142 that are not covered (e.g., not covered in the thickness direction) by the patterned photoresist 400 are removed. Because the second etching step ($2^{nd}$ etch) proceeds in a state in which the etching selection ratio of the first interlayer insulating layer 161, the second interlayer insulating layer 162, and the second gate insulating layer 142 to the amorphous silicon layer 500 is high, the amorphous silicon layer 500 may remain. That is, at least a portion of the amorphous silicon layer 500 that is not covered by the patterned photoresist 400 may be in a remaining state.

Figure 16:
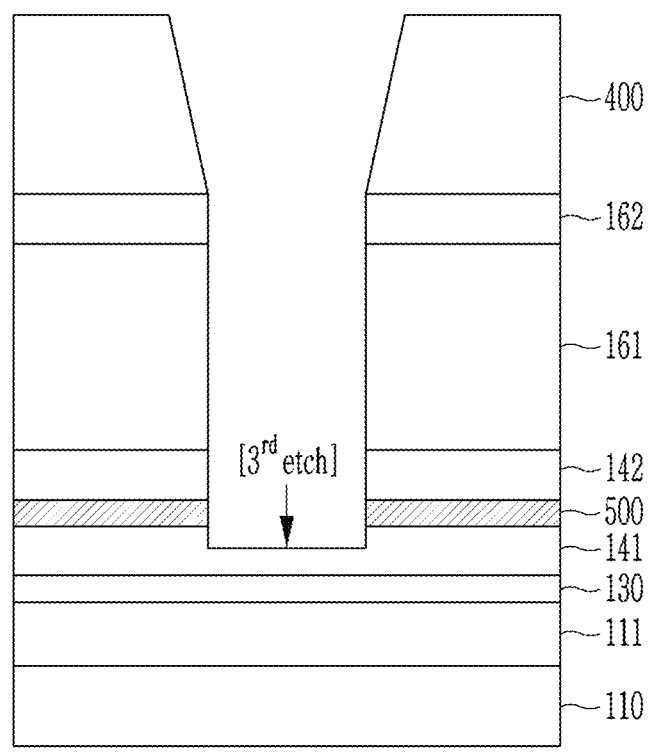

As shown in FIG. 16, a third etching step (i.e., act) ($3^{rd}$ etch) of etching the amorphous silicon layer 500 is performed. In the third etching step ($3^{rd}$ etch), at least a portion of the first gate insulating layer 141 may be etched. In this case, the etching gas may include carbon tetrafluoride ($CF_4$), oxygen ($O_2$), and the like as in the first etching step ($1^{st}$ etch). In addition, the etching gas may further include chlorine ($Cl_2$). Because the etching gas further include chlorine ($Cl_2$), the etching selection ratio of the first gate insulating layer 141 to the amorphous silicon layer 500 may be lowered. Therefore, the amorphous silicon layer 500 may be etched at a faster speed than the first gate insulating layer 141. The third etching step ($3^{rd}$ etch) may be performed until all of the amorphous silicon layer 500 that is not covered (e.g., not covered in the thickness direction) by the patterned photoresist 400 is removed. Because the third etching step ($3^{rd}$ etch) is performed in a state in which the etching selection ratio of the first gate insulating layer 141 to the amorphous silicon layer 500 is low, the first gate insulating layer 141 may remain. That is, at least a portion of the first gate insulating layer 141 that is not covered by the patterned photoresist 400 may be in a remaining state.

Figure 17:
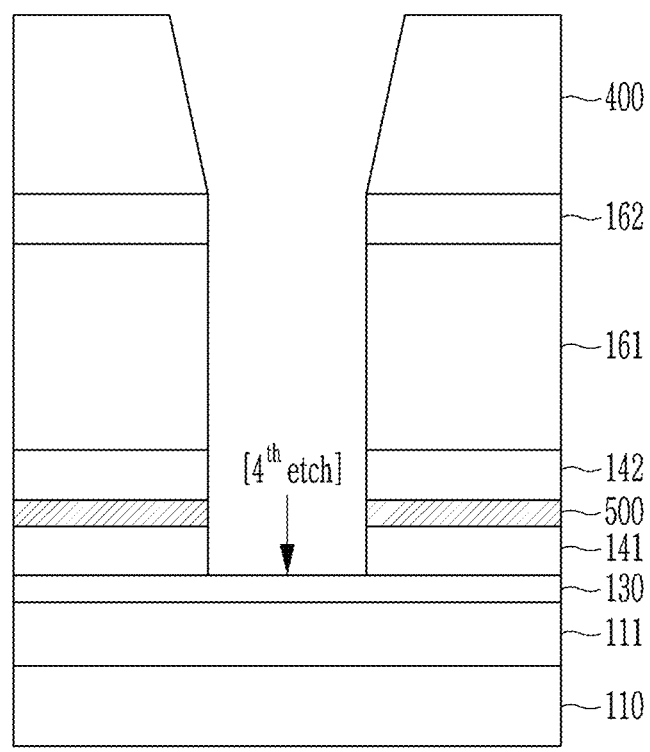

As shown in FIG. 17, a fourth etching step (i.e., act) ($4^{th}$ etch) of etching the first gate insulating layer 141 is performed. In the fourth etching step ($4^{th}$ etch), an etching gas capable of etching a silicon nitride or a silicon oxide may be used. In the fourth etching step ($4^{th}$ etch), a portion of the first gate insulating layer 141 that is not covered by the patterned photoresist 400 may be removed. Accordingly, the semiconductor layer 130 may be exposed.

In the illustrated embodiment, the amorphous silicon layer 500 is disposed between the first gate insulating layer 141 and the second gate insulating layer 142. In this case, in the second etching step ($2^{nd}$ etch), the etching selection ratio of the second gate insulating layer 142 to the amorphous silicon layer 500 is high, and in the third etching step ($3^{rd}$ etch), the etching selection ratio of the first gate insulating layer 141 to the amorphous silicon layer 500 is low. As described above, uniform or substantially uniform etching may be realized by performing the etching process through various etching steps by adjusting the etching selection ratio of the thick insulating layers in which several layers are stacked. Therefore, in the illustrated embodiment, it is possible to prevent or substantially prevent some of the insulating layers from remaining or the layer disposed under the insulating layers, for example, the semiconductor layer 130, from being damaged.

Hereinafter, a method for manufacturing a display device according to an embodiment will be described in more detail below with reference to FIGS. 12-17 again.

First, a semiconductor layer including the semiconductor 131 of the first transistor Tsw and the semiconductor 135 of the second transistor Tdr may be formed on the substrate 110 by using a polycrystalline semiconductor material. The first gate insulating layer 141 may be formed on the semiconductor layer. The amorphous silicon layer 500 may be formed on the first gate insulating layer 141. A metallic material may be deposited on the amorphous silicon layer 500 and patterned to form a first gate conductive layer including the gate electrode 151 of the first transistor Tsw and the lower gate electrode 152a of the second transistor Tdr. The second gate insulating layer 142 may be formed on the first gate conductive layer. A metallic material may be deposited on the second gate insulating layer 142 and patterned to form a second gate conductive layer. The first interlayer insulating layer 161 may be formed on the second gate conductive layer. The second interlayer insulating layer 162 may be formed on the first interlayer insulating layer 161.

Then, the second interlayer insulating layer 162, the first interlayer insulating layer 161, the second gate insulating layer 142, the amorphous silicon layer 500, and the first gate insulating layer 141 are etched to form the first opening 1161, the second opening 1162, the third opening 1163, and the fourth opening 1164. The first opening 1161, the second opening 1162, the third opening 1163, and the fourth opening 1164 are formed to penetrate the second interlayer insulating layer 162, the first interlayer insulating layer 161, the second gate insulating layer 142, the amorphous silicon layer 500, and the first gate insulating layer 141, and at least a portion of the semiconductor layer may be exposed. By forming the first opening 1161, the source region 132 of the semiconductor 131 of the first transistor Tsw may be exposed, and by forming the second opening 1162, the drain region 134 of the semiconductor 131 of the first transistor Tsw may be exposed. By forming the third opening 1163, the source region 136 of the semiconductor 135 of the second transistor Tdr may be exposed, and by forming the fourth opening 1164, the drain region 138 of the semiconductor 135 of the second transistor Tdr may be exposed.

As described above, the step (i.e., act) of etching the second interlayer insulating layer 162, the first interlayer insulating layer 161, the amorphous silicon layer 500, the second gate insulating layer 142, and the first gate insulating layer 141 may include four etching steps (i.e., acts). First, for the first etching step ($1^{st}$ etch), the photoresist 400 is applied on the second interlayer insulating layer 162, patterned, and then used as a mask, and the first etching step ($1^{st}$ etch) may be performed until at least a portion of the amorphous silicon layer 500 is exposed. Then, the second etching step ($2^{nd}$ etch) is performed to etch the first interlayer insulating layer 161, the second interlayer insulating layer 162, and the second gate insulating layer 142. The etching gas used in the second etching step ($2^{nd}$ etch) may include a material having a higher etching selection ratio of the first interlayer insulating layer 161, the second interlayer insulating layer 162, and the second gate insulating layer 142 to the amorphous silicon layer 500 than the etching gas used in the first etching step ($1^{st}$ etch). Then, the third etching step ($3^{rd}$ etch) is performed to etch the amorphous silicon layer 500. In the third etching step ($3^{rd}$ etch), because chlorine ($Cl_2$) gas is added as an etching gas, the etching selection ratio of the first gate insulating layer 141 to the amorphous silicon layer 500 may be lowered. Then, the fourth etching step ($4^{th}$ etch) of etching the first gate insulating layer 141 is performed. In the illustrated embodiment, uniform or substantially uniform etching may be realized by etching the thick insulating layers in which several layers are stacked through various etching steps by adjusting the etching selection ratio. Therefore, in the illustrated embodiment, it is possible to prevent or substantially prevent some of the insulating layers from remaining or the layer disposed under the insulating layers, for example, the semiconductor layer 130, from being damaged.

Next, a metallic material may be deposited on the second interlayer insulating layer 162 and patterned to form a first data conductive layer including the source electrode 171a and the drain electrode 172a of the first transistor Tsw and the source electrode 173 and the drain electrode 174 of the second transistor Tdr. The third interlayer insulating layer 163 may be formed on the first data conductive layer. The opening 1165 may be formed in the third interlayer insulating layer 163, and the second data conductive layer including the connection electrode 176 may be formed on the third interlayer insulating layer 163. The passivation layer 180 may be formed on the second data conductive layer. The opening 181 may be formed in the passivation layer 180, and the anode electrode 191 may be formed on the passivation layer 180. In one or more embodiments, the partition wall 350 may be formed on the anode electrode 191, the opening 351 may be formed in the partition wall 350, and the light emitting element layer 370 may be formed in the opening 351. The cathode electrode 270 may be formed on the light emitting element layer 370 and the partition wall 350.

The structure of the display device according to the embodiment described above may be applied to various suitable circuit diagrams. Hereinafter, a circuit diagram of a display device according to an embodiment will be described in more detail below with reference to FIG. 18.

Figure 18:
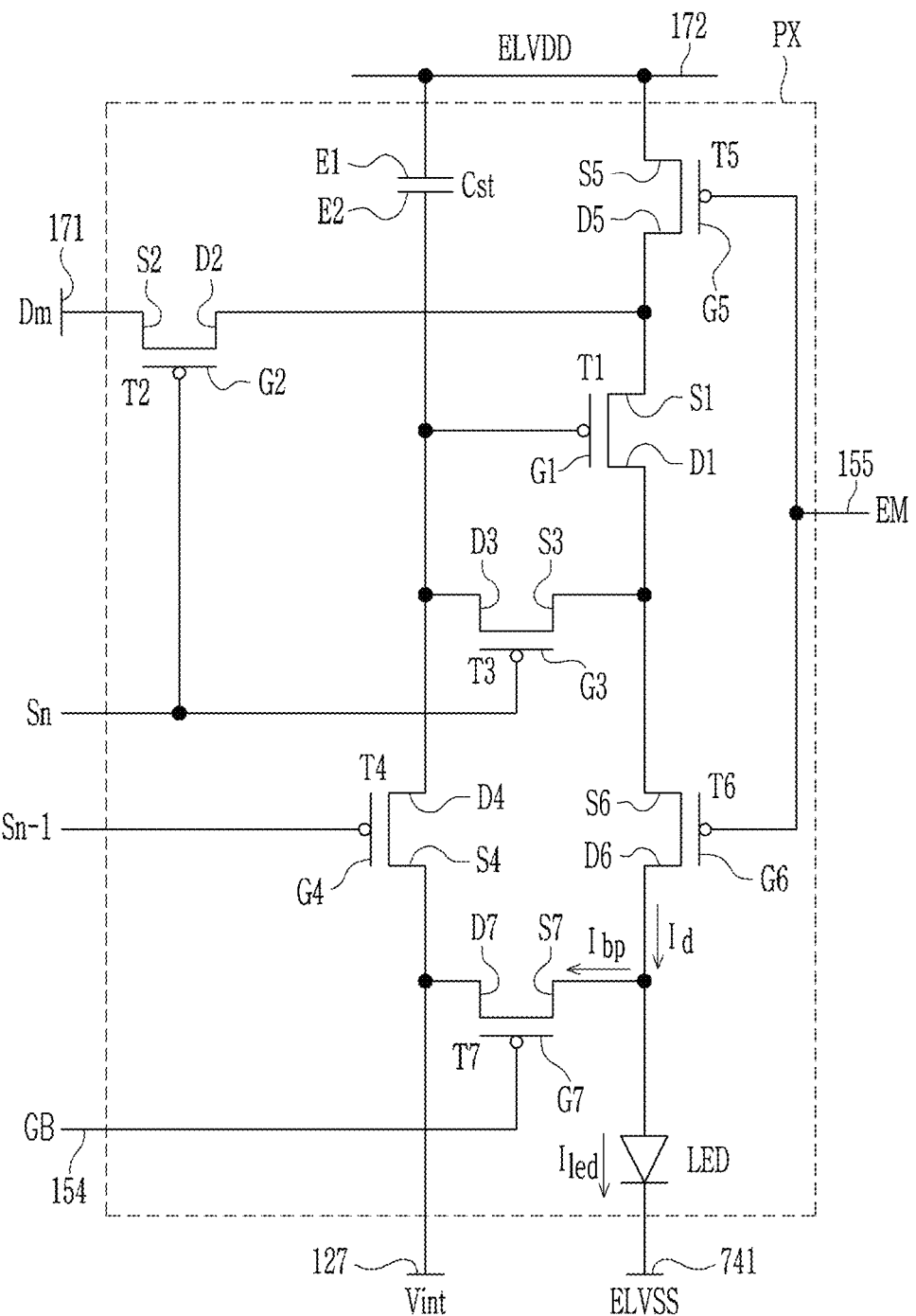
FIG. 18 illustrates a circuit diagram of a display device according to an embodiment.

FIG. 18 illustrates a circuit diagram of a display device according to an embodiment.

As shown in FIG. 18, one pixel PX of the display device according to the embodiment includes a plurality of transistors T1, T2, T3, T4, T5, T6, and T7 (i.e., a driving transistor T1, a second transistor T2, a third transistor T3, a fourth transistor T4, a fifth transistor T5, a sixth transistor T6, and a seventh transistor T7) connected to several signal lines, a storage capacitor Cst, and a light emitting diode LED.

The display device according to the embodiment includes a display area in which an image is displayed, and the pixels PX are arranged in various suitable forms in the display area.

The plurality of transistors T1, T2, T3, T4, T5, T6, and T7 include a driving transistor T1, a switching transistor connected to a scan line Sn, that is, a second transistor T2 and a third transistor T3, and other transistors (hereinafter referred to as compensation transistors) that are transistors for performing operations desirable for operating the light emitting diode LED. These compensation transistors T4, T5, T6, and T7 may include a fourth transistor T4, a fifth transistor T5, a sixth transistor T6, and a seventh transistor T7.

A plurality of signal lines include a scan line Sn, a previous scan line Sn-1, a light emission control line 155, a bypass control line 154, a data line 171, a driving voltage line 172, an initialization voltage line 127, and a common voltage line 741. The bypass control line 154 may be a portion of the previous scan line Sn-1, or may be connected (e.g., electrically connected) thereto. Alternatively, the bypass control line 154 may be a portion of the scan line Sn, or may be connected (e.g., electrically connected) thereto.

The scan line Sn is connected to a gate driver to transmit a scan signal to the second transistor T2 and the third transistor T3. The previous scan line Sn-1 is connected to the gate driver to transmit a previous scan signal applied to the pixel PX positioned at a previous stage to the fourth transistor T4. The light emission control line 155 is connected to a light emission controller to transmit a light emission control signal that controls a light emitting time of the light emitting diode LED to the fifth transistor T5 and the sixth transistor T6. The bypass control line 154 transmits a bypass signal to the seventh transistor T7.

The data line 171 is a wire that transmits a data voltage generated by the data driver, and luminance at which the light emitting diode LED emits light is changed according to the data voltage. The driving voltage line 172 applies a driving voltage. The initialization voltage line 127 transmits an initialization voltage that initializes the driving transistor T1. The common voltage line 741 applies a common voltage. Voltages applied to the driving voltage line 172, the initialization voltage line 127, and the common voltage line 741 may be constant.

Hereinafter, a plurality of transistors will be described in more detail below.

The driving transistor T1 is a transistor that adjusts a size of a current outputted according to the data voltage applied thereto. An outputted driving current $I_d$ is applied to the light emitting diode LED to adjust brightness of the light emitting diode LED according to a data voltage. To this end, a first electrode S1 of the driving transistor T1 may be disposed to receive a driving voltage. The first electrode S1 is connected to the driving voltage line 172 via the fifth transistor T5. In addition, the first electrode S1 of the driving transistor T1 is connected to a second electrode D2 of the second transistor T2 to receive a data voltage. The second electrode D1 (output electrode) of the driving transistor T1 is disposed to be able to output a current toward the light emitting diode LED. The second electrode D1 of the driving transistor T1 is connected to an anode electrode of the light emitting diode LED via the sixth transistor T6. Meanwhile, a gate electrode G1 thereof is connected to an electrode (second storage electrode E2) of the storage capacitor Cst. Accordingly, a voltage of the gate electrode G1 is changed according to a voltage stored in the storage capacitor Cst, and accordingly, the driving current $I_d$ outputted from the driving transistor T1 is changed.

The second transistor T2 is a transistor that allows a data voltage to be inputted to the pixel PX. A gate electrode G2 thereof is connected to the scan line Sn, and a first electrode S2 thereof is connected to the data line 171. A second electrode D2 of the second transistor T2 is connected to the first electrode S1 of the driving transistor T1. When the second transistor T2 is turned on according to a scan signal transmitted through the scan line Sn, a data voltage transmitted through the data line 171 is transmitted to the first electrode S1 of the driving transistor T1.

The third transistor T3 is a transistor that allows a data voltage to pass through the driving transistor T1 so that a changed compensation voltage is transmitted to the second storage electrode E2 of the storage capacitor Cst. A gate electrode G3 thereof is connected to the scan line Sn, and a first electrode S3 thereof is connected to the second electrode D1 of the driving transistor T1. A second electrode D3 of the third transistor T3 is connected to the second storage electrode E2 of the storage capacitor Cst and the gate electrode G1 of the driving transistor T1. The third transistor T3 is turned on according to a scan signal transmitted through the scan line Sn to connect the gate electrode G1 and the second electrode D1 of the driving transistor T1 and to connect the second electrode D1 of the driving transistor T1 and the second storage electrode E2 of the storage capacitor Cst.

The fourth transistor T4 initializes the gate electrode G1 of the driving transistor T1 and the second storage electrode E2 of the storage capacitor Cst. A gate electrode G4 thereof is connected to the previous scan line Sn-1, and a first electrode S4 thereof is connected to the initialization voltage line 127. A second electrode D4 of the fourth transistor T4 is connected to the second storage electrode E2 of the storage capacitor Cst and the gate electrode G1 of the driving transistor T1 via the second electrode D3 of the third transistor T3. The fourth transistor T4 transmits an initialization voltage to the gate electrode G1 of the driving transistor T1 and the second storage electrode E2 of the storage capacitor Cst according to a previous scan signal transmitted through the previous scan line Sn-1. Accordingly, a gate voltage of the gate electrode G1 of the driving transistor T1 and the storage capacitor Cst are initialized. The initialization voltage may have a low voltage value, and it may be a voltage capable of turning on the driving transistor T1.

The fifth transistor T5 serves to transmit a driving voltage to the driving transistor T1. A gate electrode G5 thereof is connected to the light emission control line 155, and a first electrode S5 thereof is connected to the driving voltage line 172. A second electrode D5 of the fifth transistor T5 is connected to a first electrode S1 of the driving transistor T1.

The sixth transistor T6 serves to transmit the driving current $I_d$ outputted from the driving transistor T1 to the light emitting diode LED. A gate electrode G6 thereof is connected to the light emission control line 155, and a first electrode S6 thereof is connected to the second electrode D1 of the driving transistor T1. A second electrode D6 of the sixth transistor T6 is connected to the anode of the light emitting diode LED.

The fifth transistor T5 and the sixth transistor T6 are concurrently (e.g., simultaneously) turned on according to a light emission control signal transmitted through the light emission control line 155, and when a driving voltage is applied to the first electrode S1 of the driving transistor T1 through the fifth transistor T5, the driving transistor T1 outputs the driving current $I_d$ according to a voltage of the gate electrode G1 of the driving transistor T1 (that is, a voltage of the second storage electrode E2 of the storage capacitor Cst). The outputted driving current $I_d$ is transmitted to the light emitting diode LED through the sixth transistor T6. The light emitting diode LED emits light as a current $I_{led}$ flows therethrough.

The seventh transistor T7 serves to initialize the anode of the light emitting diode LED. A gate electrode G7 thereof is connected to the bypass control line 154, a first electrode S7 thereof is connected to the anode of the light emitting diode LED, and a second electrode D7 thereof is connected to the initialization voltage line 127. The bypass control line 154 may be connected to the previous scan line Sn-1, and a bypass signal is applied with the same timing signal as the previous scan signal. The bypass control line 154 may not be connected to the previous scan line Sn-1 to transmit a separate signal from the previous scan signal. When the seventh transistor T7 is turned on according to a bypass signal GB, an initialization voltage is applied to the anode of the light emitting diode LED such that the light emitting diode LED is initialized.

The first storage electrode E1 of the storage capacitor Cst is connected to the driving voltage line 172, and the second storage electrode E2 thereof is connected to the gate electrode G1 of the driving transistor T1, the second electrode D3 of the third transistor T3, and the second electrode D4 of the fourth transistor T4. As a result, the second storage electrode E2 determines a voltage of the gate electrode G1 of the driving transistor T1, and it receives a data voltage through the second electrode D3 of the third transistor T3, or an initialization voltage through the second electrode D4 of the fourth transistor T4.

Meanwhile, the anode of the light emitting diode LED is connected to the second electrode D6 of the sixth transistor T6 and the first electrode S7 of the seventh transistor T7, and the cathode thereof is connected to the common voltage line 741 that transmits a common voltage.

In the above description, it has been described that one pixel includes seven transistors T1 to T7 and one storage capacitor Cst, but the present disclosure is not limited thereto, and the number of transistors, the number of capacitors, and their connection relationship may be variously changed in a suitable manner.

Hereinafter, another circuit diagram of the display device according to the embodiment will be described in more detail below with reference to FIG. 19.

Figure 19:
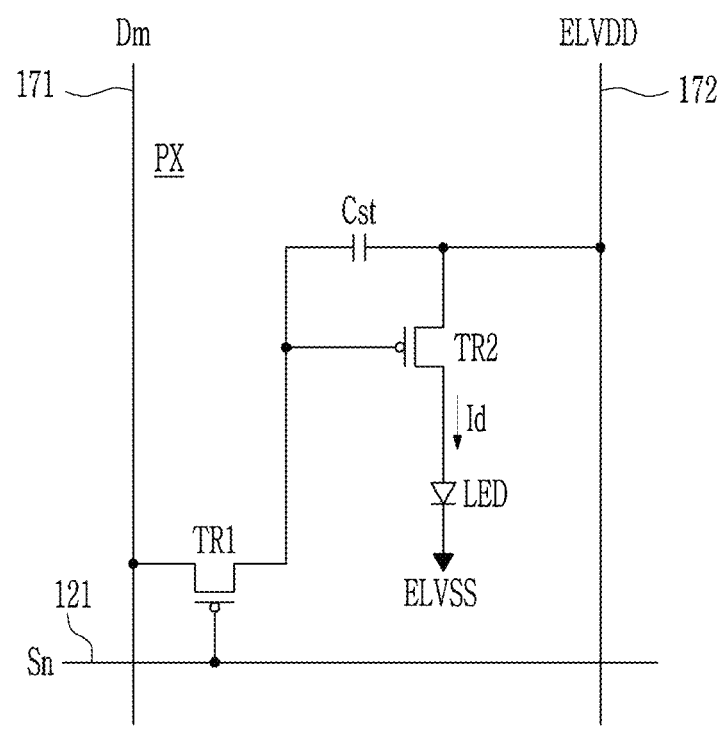
FIG. 19 illustrates a circuit diagram of a display device according to an embodiment.

FIG. 19 illustrates a circuit diagram of a display device according to an embodiment.

As shown in FIG. 19, one pixel may include a second transistor TR2 for controlling a light emitting diode LED, a first transistor TR1 for switching the second transistor TR2, and a storage capacitor Cst connected to a driving voltage line 172. The first transistor TR1 may be a switching transistor, and the second transistor TR2 may be a driving transistor.

The first transistor TR1 may include a gate electrode, a source electrode, and a drain electrode. The gate electrode of the first transistor TR1 may be connected to a scan line Sn, and the source electrode may be connected to a data line Dm. The drain electrode of the first transistor TR1 may be connected to a gate electrode of the second transistor TR2. The first transistor TR1 may transmit a data signal applied to the data line Dm to the second transistor TR2 according to a scan signal applied to the scan line Sn.

The second transistor TR2 may include a gate electrode, a source electrode, and a drain electrode. The gate electrode of the second transistor TR2 may be connected to the first transistor TR1, the source electrode thereof may be connected to the driving voltage line 172, and the drain electrode thereof may be connected to the light emitting diode LED.

The light emitting diode LED may include a light emission layer, and an anode electrode and a cathode electrode facing each other with the light emission layer therebetween. The anode electrode may be connected to the drain electrode of the second transistor TR2. The cathode may be connected to a common voltage line 741 to receive a common voltage. The light emission layer emits light according to an output signal of the second transistor TR2, so that an image may be displayed by emitting or not emitting light.

The storage capacitor Cst is connected between the gate electrode and the source electrode of the second transistor TR2, and may charge and maintain a data signal inputted to the gate electrode of the second transistor TR2.

While this disclosure has been described in connection with what is presently considered to be practical exemplary embodiments, it is to be understood that the present disclosure is not limited to the disclosed embodiments, but, on the contrary, is intended to cover various modifications and equivalent arrangements included within the spirit and scope of the appended claims, and equivalents thereof.

DESCRIPTION OF SOME OF THE REFERENCE SYMBOLS

110: substrate
111: buffer layer
130: semiconductor layer
131: semiconductor of first transistor
135: semiconductor of second transistor
141: first gate insulating layer
142: second gate insulating layer
151: gate electrode of first transistor
152: gate electrode of second transistor
161: first interlayer insulating layer
162: second interlayer insulating layer
163: third interlayer insulating layer
400: photoresist
500: amorphous silicon layer
1161: first opening
1162: second opening
1163: third opening
1164: fourth opening

What is claimed is:

1. A method for etching an insulating layer, the method comprising:
sequentially forming a first gate insulating layer, an amorphous silicon layer, a first interlayer insulating layer, and a second interlayer insulating layer on a substrate;
applying a photoresist on the second interlayer insulating layer, and patterning the photoresist through a photoprocess;
first etching the second interlayer insulating layer and the first interlayer insulating layer by utilizing the patterned photoresist as a mask;
second etching the second interlayer insulating layer and the first interlayer insulating layer;
third etching the amorphous silicon layer; and
fourth etching the first gate insulating layer,
wherein an etching gas utilized in the second etching comprises a material having a higher etching selection ratio of the first and second interlayer insulating layers to the amorphous silicon layer than an etching gas utilized in the first etching.

2. The method for etching the insulating layer of claim 1, wherein
the first etching is performed until at least a portion of the amorphous silicon layer is exposed.

3. The method for etching the insulating layer of claim 1, wherein
the etching gas utilized in the second etching comprises at least one of pentafluoroethane ($C_2HF_5$), argon (Ar), or hydrogen (H2).

4. The method for etching the insulating layer of claim 1, wherein
at least a portion of the amorphous silicon layer is etched in the second etching.

5. The method for etching the insulating layer of claim 1, wherein
the etching gas utilized in the third etching comprises chlorine ($Cl_2$).

6. The method for etching the insulating layer of claim 1, wherein
the etching gas utilized in the third etching comprises at least one of carbon tetrafluoride ($CF_4$) or oxygen ($O_2$).

7. The method for etching the insulating layer of claim 1, further comprising
forming a second gate insulating layer on the first gate insulating layer,
wherein the second gate insulating layer is between the first gate insulating layer and the amorphous silicon layer, and
wherein the second gate insulating layer is etched in the fourth etching.

8. The method for etching the insulating layer of claim 7, wherein
in the second etching, an etching selection ratio of the first interlayer insulating layer and the amorphous silicon layer is 10:1.

9. The method for etching the insulating layer of claim 7, wherein
in the third etching, an etching selection ratio of the amorphous silicon layer and the second gate insulating layer is 3:1.

10. The method for etching the insulating layer of claim 7, wherein
at least a portion of the second gate insulating layer is etched in the third etching.

11. The method for etching the insulating layer of claim 1, further comprising
forming a second gate insulating layer on the amorphous silicon layer,
wherein the second gate insulating layer is between the amorphous silicon layer and the first interlayer insulating layer, and
wherein the second gate insulating layer is etched in the second etching.

12. The method for etching the insulating layer of claim 11, wherein in the second etching, an etching selection ratio of the second gate insulating layer and the amorphous silicon layer is 10:1.

13. The method for etching the insulating layer of claim 11, wherein
in the third etching, the etching selection ratio of the amorphous silicon layer and the first gate insulating layer is 3:1.

14. The method for etching the insulating layer of claim 11, wherein
at least a portion of the first gate insulating layer is etched in the third etching.

15. A method for manufacturing a display device, the method comprising:
forming a semiconductor layer on a substrate;
forming a first gate insulating layer on the semiconductor layer;
forming a first gate conductive layer on the first gate insulating layer;
forming an amorphous silicon layer on the first gate insulating layer;
forming a first interlayer insulating layer on the amorphous silicon layer;
forming a second interlayer insulating layer on the first interlayer insulating layer;
etching the second interlayer insulating layer, the first interlayer insulating layer, and the first gate insulating layer to form an opening; and
forming a first data conductive layer on the second interlayer insulating layer, the first data conductive layer connecting to the semiconductor layer through the opening,
wherein the forming of the opening comprises:
applying a photoresist on the second interlayer insulating layer, and patterning the photoresist through a photo-process;
first etching the second interlayer insulating layer and the first interlayer insulating layer until at least a portion of the amorphous silicon layer is exposed by utilizing the patterned photoresist as a mask;
second etching the second interlayer insulating layer and the first interlayer insulating layer;
third etching the amorphous silicon layer; and
fourth etching the first gate insulating layer,
wherein an etching gas utilized in the second etching comprises a material having a higher etching selection ratio of the first and second interlayer insulating layers to the amorphous silicon layer than an etching gas utilized in the first etching.

16. The method for manufacturing the display device of claim 15, further comprising:
forming a second gate insulating layer on the first gate conductive layer; and
forming a second gate conductive layer on the second gate insulating layer,
wherein the amorphous silicon layer is on the second gate insulating layer.

17. The method for manufacturing the display device of claim 15, further comprising:
forming a second gate insulating layer on the amorphous silicon layer; and
forming a second gate conductive layer on the second gate insulating layer,
wherein the amorphous silicon layer is on the first gate insulating layer.

* * * * *